(12) United States Patent
Kim et al.

(10) Patent No.: US 12,396,356 B2
(45) Date of Patent: Aug. 19, 2025

(54) DISPLAY DEVICE INCLUDING A LIGHT CONTROL LAYER AND AN INPUT SENSOR

(71) Applicant: Samsung Display Co., Ltd., Yongin-Si (KR)

(72) Inventors: Su Jeong Kim, Seoul (KR); Taeho Kim, Yongin-si (KR); Jongho Son, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 501 days.

(21) Appl. No.: 17/975,912

(22) Filed: Oct. 28, 2022

(65) Prior Publication Data
US 2023/0276681 A1 Aug. 31, 2023

(30) Foreign Application Priority Data
Feb. 28, 2022 (KR) ........................ 10-2022-0026345

(51) Int. Cl.
*G06F 3/041* (2006.01)
*H10K 50/86* (2023.01)
(Continued)

(52) U.S. Cl.
CPC ............ *H10K 59/60* (2023.02); *H10K 50/865* (2023.02); *H10K 59/38* (2023.02)

(58) Field of Classification Search
CPC .......... H10D 30/6704; H10D 30/6732; H10D 30/6739; H10D 30/6745; H10D 30/6746; H10D 30/6755; H10D 64/62; H10D 86/0231; H10D 86/40; H10D 86/423; H10D 86/441; H10D 86/481; H10D 86/60; H10D 99/00; H10K 50/865; H10K 59/38; H10K 59/40; H10K 59/60; H10K 59/8792
See application file for complete search history.

(56) References Cited

U.S. PATENT DOCUMENTS 7,833,569 B2 11/2010 Chae et al.
2010/0117528 A1* 5/2010 Fukuda .................. H10K 59/38
313/505

(Continued)

FOREIGN PATENT DOCUMENTS

KR 10-1246720 3/2013
KR 10-1296651 8/2013
(Continued)

*Primary Examiner* — Insa Sadio
(74) *Attorney, Agent, or Firm* — F. CHAU & ASSOCIATES, LLC

(57) ABSTRACT

A display device includes: a display panel including a light emitting element and a pixel definition layer including a pixel opening; an input sensor disposed on the display panel and including at least one insulating layer, a sensing electrode overlapping the pixel definition layer, and a floating pattern overlapping the pixel opening; and a light control layer disposed on the input sensor and including a light blocking pattern and a color filter, wherein the light blocking pattern includes a first pattern and a second pattern, wherein the first pattern is includes a light blocking opening corresponding to the pixel opening, wherein the second pattern is spaced apart from the first pattern, is disposed in the light blocking opening, and overlaps the floating pattern, and wherein the color filter overlaps the light blocking opening.

20 Claims, 15 Drawing Sheets

(51) Int. Cl.
*H10K 59/38* (2023.01)
*H10K 59/60* (2023.01)

(56) References Cited

U.S. PATENT DOCUMENTS

| | | | |
|---|---|---|---|
| 2012/0120616 A1* | 5/2012 | Katsui | H10K 59/131 |
| | | | 174/257 |
| 2015/0124179 A1 | 5/2015 | Ko et al. | |
| 2021/0202594 A1 | 7/2021 | Jo et al. | |

FOREIGN PATENT DOCUMENTS

| KR | 10-1362147 | 2/2014 |
|---|---|---|
| KR | 10-1469471 | 12/2014 |
| KR | 10-2015-0051490 | 5/2015 |
| KR | 10-2021-0081603 | 7/2021 |
| KR | 10-2021-0084913 | 7/2021 |

* cited by examiner

DISPLAY DEVICE INCLUDING A LIGHT CONTROL LAYER AND AN INPUT SENSOR

CROSS-REFERENCE TO RELATED APPLICATION

This U.S. non-provisional patent application claims priority under 35 U.S.C. § 119 to Korean Patent Application No. 10-2022-0026345, filed on Feb. 28, 2022, the disclosure of which is incorporated by reference herein in its entirety.

TECHNICAL FIELD

The present invention relates to a display device. More particularly, the present invention relates to a display device including a light control layer and an input sensor.

DISCUSSION OF THE RELATED ART

Various display devices that are applied to multimedia devices, such as televisions, mobile phones, tablet computers, and game devices, are under development. A display device generally includes a variety of optical functional layers to provide a color image with relatively high image quality to a user.

Currently, thin display devices are under development to implement various types of display devices, such as a display device including a curved surface, a rollable display device, and a foldable display device. For example, a thin display device may be implemented by reducing the number of optical functional layers and employing an optical functional layer having multiple functions.

SUMMARY

According to an embodiment of the present invention, a display device includes: a display panel including a light emitting element and a pixel definition layer including a pixel opening; an input sensor disposed on the display panel and including at least one insulating layer, a sensing electrode overlapping the pixel definition layer, and a floating pattern overlapping the pixel opening; and a light control layer disposed on the input sensor and including a light blocking pattern and a color filter, wherein the light blocking pattern includes a first pattern and a second pattern, wherein the first pattern is includes a light blocking opening corresponding to the pixel opening, wherein the second pattern is spaced apart from the first pattern, is disposed in the light blocking opening, and overlaps the floating pattern, and wherein the color filter overlaps the light blocking opening.

In an embodiment of the present invention, the at least one insulating layer includes a first insulating layer and a second insulating layer disposed on the first insulating layer, wherein the sensing electrode includes a bridge electrode and a mesh electrode, wherein the bridge electrode is disposed between the first insulating layer and the second insulating layer, wherein the mesh electrode is disposed on the second insulating layer and includes a mesh opening corresponding to the pixel opening, and wherein the floating pattern is disposed on the second insulating layer, is spaced apart from the mesh electrode, and is disposed in the mesh opening.

In an embodiment of the present invention, the at least one insulating layer further includes a third insulating layer disposed on the second insulating layer and covering the mesh electrode and the floating pattern, and the second pattern is disposed on the third insulating layer.

In an embodiment of the present invention, the first pattern is disposed on the second insulating layer and overlaps the mesh electrode, and the second pattern is disposed on the second insulating layer and overlaps the floating pattern.

In an embodiment of the present invention, the input sensor further includes an additional floating pattern disposed between the first insulating layer and the second insulating layer.

In an embodiment of the present invention, the floating pattern includes a floating opening, and the additional floating pattern overlaps the floating opening.

In an embodiment of the present invention, each of the floating opening and the additional floating pattern has a circular shape or a polygonal shape.

In an embodiment of the present invention, the at least one insulating layer further includes a third insulating layer disposed on the second insulating layer and covering the mesh electrode and the floating pattern, and the second pattern is disposed on the third insulating layer.

In an embodiment of the present invention, the first pattern is disposed on the second insulating layer and covers the mesh electrode, and the second pattern is disposed on the second insulating layer and covers the floating pattern.

In an embodiment of the present invention, the second insulating layer includes a groove removing a portion of the second insulating layer from an upper surface of the second insulating layer along a thickness direction of the second insulating layer, and the floating pattern covers the groove.

In an embodiment of the present invention, an inner side surface of the groove of the second insulating layer has a curvature.

In an embodiment of the present invention, the at least one insulating layer further includes a third insulating layer disposed on the second insulating layer and covering the mesh electrode and the floating pattern, and the second pattern is disposed on the third insulating layer.

In an embodiment of the present invention, the first pattern is disposed on the second insulating layer, is in contact with the mesh electrode, and covers the mesh electrode, and the second pattern is disposed on the second insulating layer, is in contact with the floating pattern, and covers the floating pattern.

In an embodiment of the present invention, the second pattern has a circular shape or a polygonal shape.

In an embodiment of the present invention, the floating pattern includes a metal material.

In an embodiment of the present invention, the pixel definition layer has a black color and includes a light scattering particle.

In an embodiment of the present invention, the pixel opening is a plurality of pixel openings including first, second, and third pixel openings, wherein the first pixel opening has a size greater than a size of the second pixel opening and smaller than a size of the third pixel opening, wherein the second pattern includes first, second, and third sub-patterns respectively overlapping the first, second, and third pixel openings, and the first sub-pattern has a size greater than a size of the second sub-pattern and smaller than a size of the third sub-pattern.

In an embodiment of the present invention, the floating pattern is electrically insulated from the sensing electrode.

According to an embodiment of the present invention, a display device includes: a display panel including a light emitting area and a non-light-emitting area; an input sensor disposed on the display panel and including a sensing electrode and a reflective pattern, wherein the sensing electrode overlaps the non-light-emitting area, and the reflective pattern overlaps the light emitting area; and a light control layer disposed on the input sensor and including a light blocking pattern including a first pattern, a second pattern and a color filter, wherein the first pattern overlaps the non-light-emitting area, wherein the second pattern is spaced apart from the first pattern and overlaps the reflective pattern, and wherein the color filter overlaps the light emitting area and the non-light-emitting area.

According to an embodiment of the present invention, a display device includes: a display panel including a light emitting element and a pixel definition layer including a pixel opening; an input sensor disposed on the display panel; and a light control layer disposed on the input sensor and including a light absorbing pattern and a color filter overlapping the pixel opening, wherein the light absorbing pattern including a first pattern and a second pattern, wherein the first pattern includes a display opening corresponding to the pixel opening and overlaps the pixel definition layer, and wherein the second pattern is spaced apart from the first pattern and is disposed in the display opening.

BRIEF DESCRIPTION OF THE DRAWINGS

The above and other features of the present invention will become more apparent by describing in detail embodiments thereof with reference to the accompanying drawings, in which.

DETAILED DESCRIPTION OF THE EMBODIMENTS

Figure 1A:
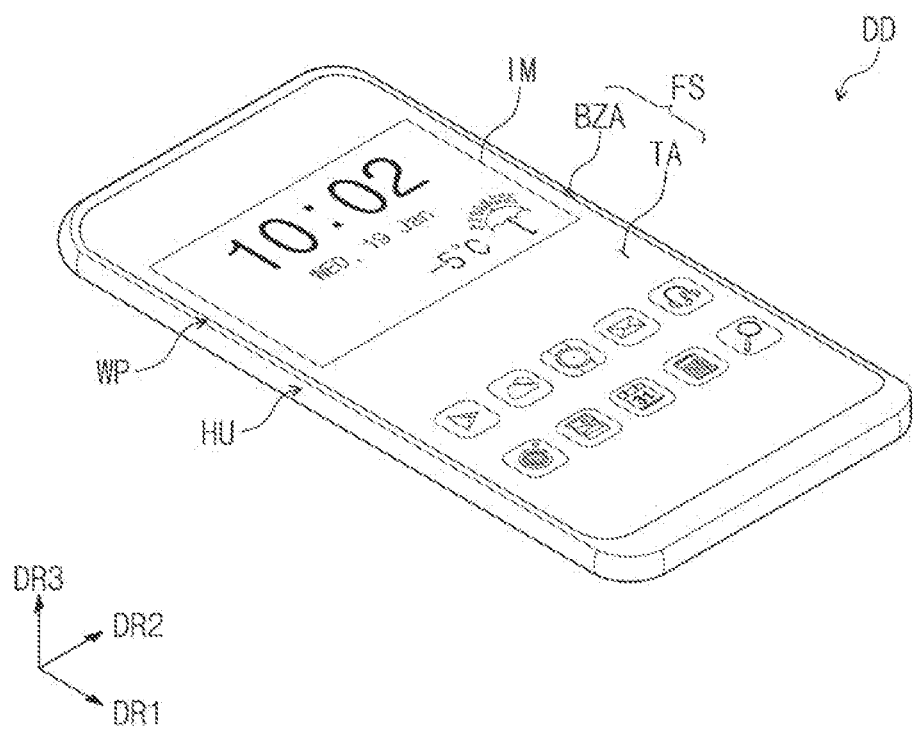
FIG. 1A is a perspective view of a display device according to an embodiment of the present invention.

In the present invention, it will be understood that when an element (or area, layer, or portion) is referred to as being "on", "connected to" or "coupled to" another element or layer, the element can be directly on, connected or coupled to the other element or layer or intervening elements or layers may be present.

Like numerals may refer to like elements throughout. In the drawings, various thicknesses, lengths, and angles are shown and while the arrangement shown does indeed represent an embodiment of the present invention, it is to be understood that modifications of the various thicknesses, lengths, and angles may be possible within the spirit and scope of the present invention and the present invention is not necessarily limited to the particular thicknesses, lengths, and angles shown. As used herein, the term "and/or" may include any and all combinations of one or more of the associated listed items.

It will be understood that, although the terms first, second, etc. may be used herein to describe various elements, these elements should not be limited by these terms. These terms are only used to distinguish one element from another element. For example, a first element discussed below could be termed a second element without departing from the teachings of the present invention. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another elements or features as shown in the figures. It will be understood that the spatially relative terms are intended to encompass different orientations of the device in use or operation in addition to the orientation depicted in the figures. For example, if the device in the figures is turned over, components described as "below" or "beneath" other components or features would then be oriented "above" the other components or features.

Hereinafter, embodiments of the present invention will be described with reference to accompanying drawings.

Figure 1B:
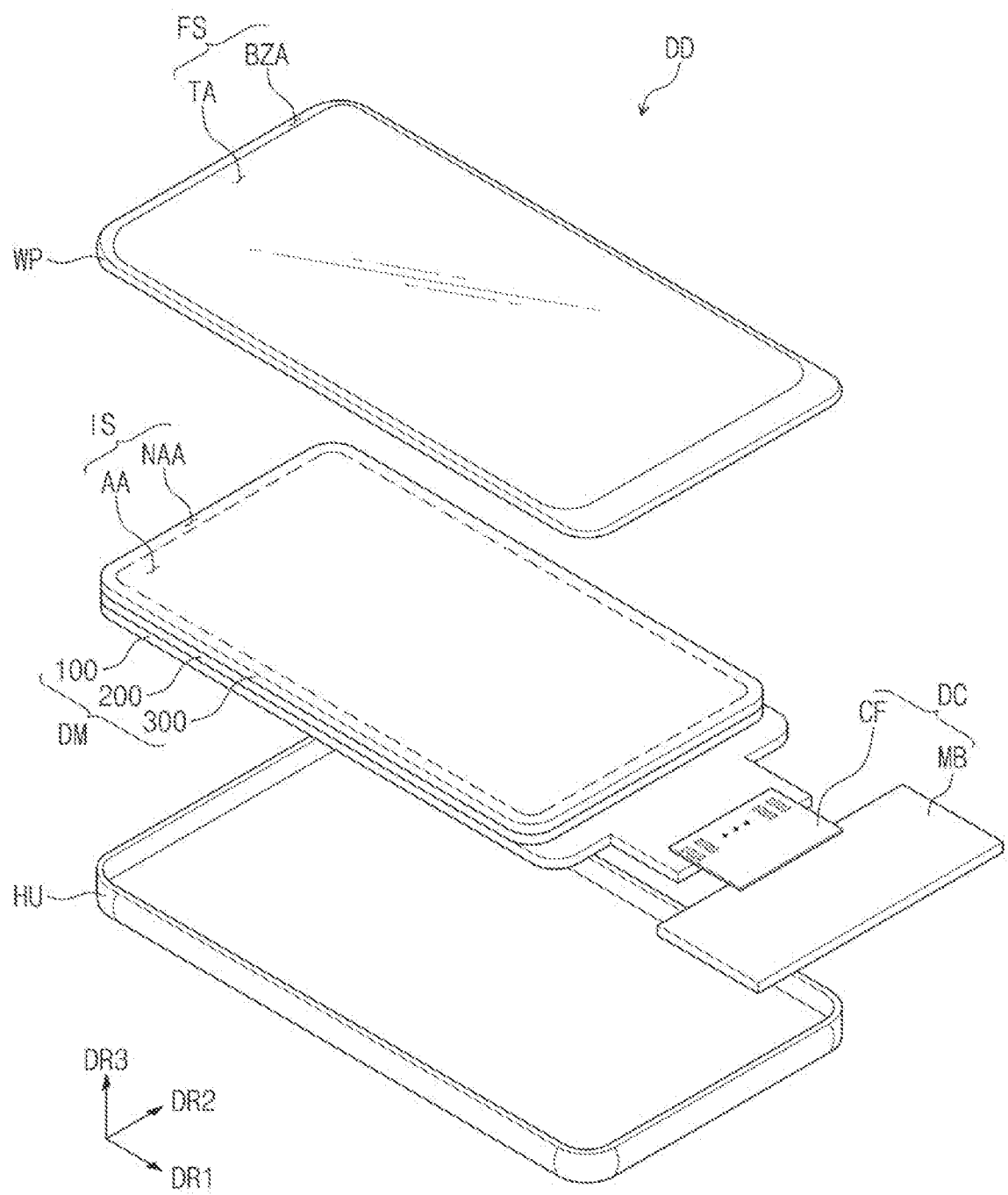
FIG. 1B is an exploded perspective view of a display device according to an embodiment of the present invention.
Figure 2A:
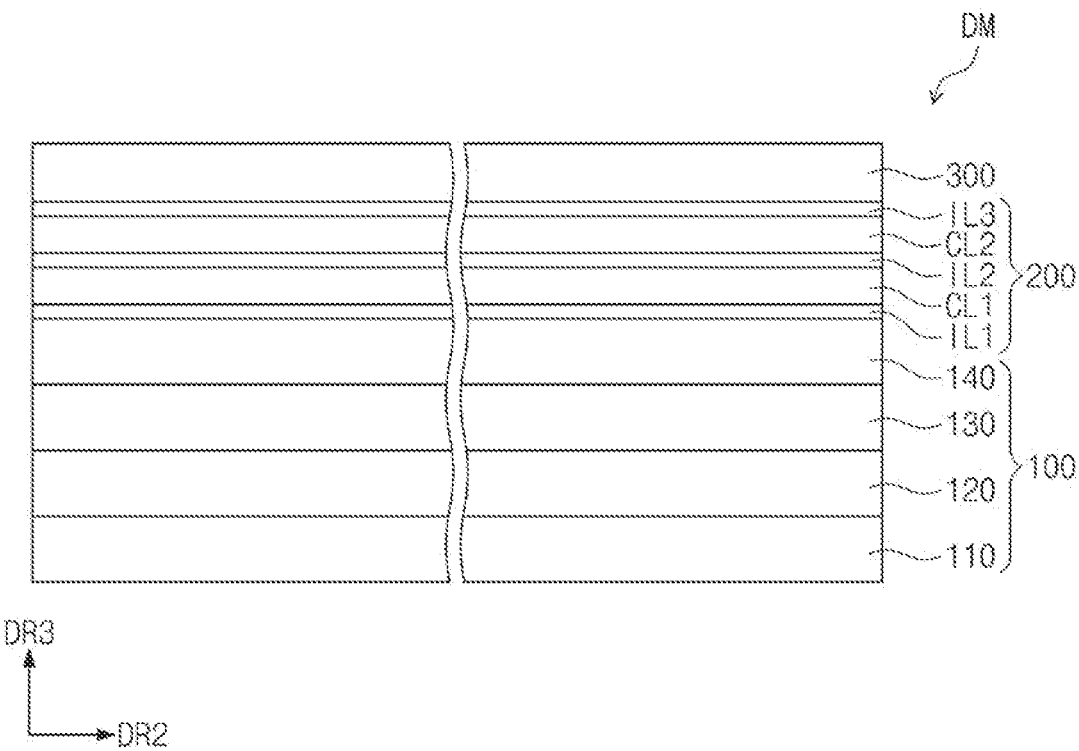
FIG. 2A is a cross-sectional view of a display module according to an embodiment of the present invention.
Figure 2B:
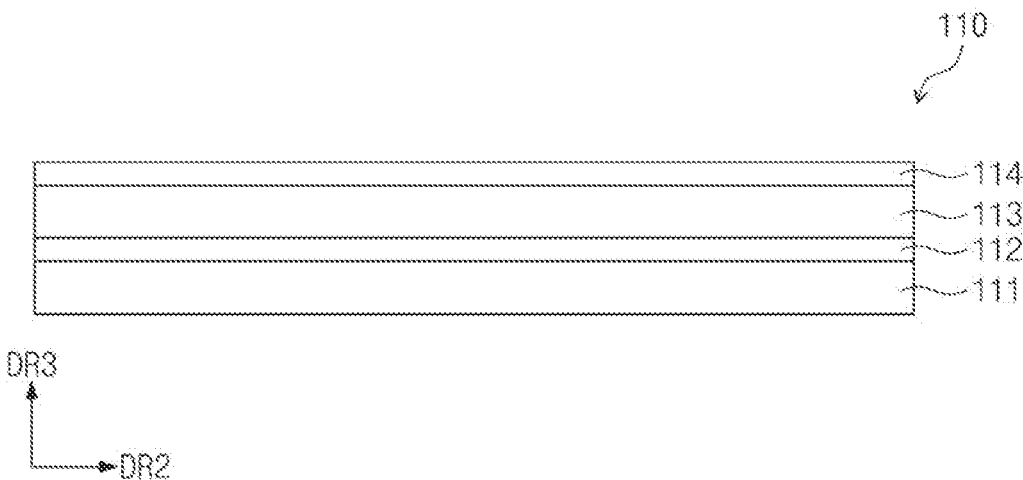
FIG. 2B is a cross-sectional view of a portion of a display module according to an embodiment of the present invention.

FIG. 1A is a perspective view of a display device DD according to an embodiment of the present invention. FIG. 1B is an exploded perspective view of the display device DD according to an embodiment of the present invention. FIG. 2A is a cross-sectional view of a display module DM according to an embodiment of the present invention. FIG. 2B is a cross-sectional view of a portion of the display module DM according to an embodiment of the present invention.

Referring to FIG. 1A, the display device DD may be a device that is activated in response to an electrical signal. The display device DD may include various embodiments. For example, the display device DD may be applied to a large-sized electronic item, such as a television set, a monitor, or an outdoor billboard, and a small and medium-sized electronic item, such as a personal computer, a notebook computer, a personal digital assistant, a car navigation unit, a game unit, a mobile electronic device, and a camera. In the present embodiment, a smartphone is shown as a representative example.

The display device DD may display an image IM through a display surface FS, which is substantially parallel to each of a first direction DR1 and a second direction DR2, toward a third direction DR3 which crosses the first and second direction DR1 and DR2. The image IM may include a video and a still image. FIG. 1A shows a clock widget and application icons as a representative example of the image IM. The display surface FS through which the image IM is displayed may correspond to a front surface of the display device DD and a front surface of a window panel WP.

In the present embodiment, front (or, e.g., upper) and rear (or, e.g., lower) surfaces of each member of the display device DD may be defined with respect to a direction in which the image IM is displayed. The front and rear surfaces may be opposite to each other in the third direction DR3, and a normal line direction of each of the front and rear surfaces may be substantially parallel to the third direction DR3. In addition, directions indicated by the first, second, and third directions DR1, DR2, and DR3 may be relative to each other, and thus, the directions indicated by the first, second, and third directions DR1, DR2, and DR3 may be changed to other directions. In the following descriptions, the expression "when viewed in a plane" may mean a state of being viewed in the third direction DR3.

Referring to FIGS. 1B to 2B, the display device DD may include the window panel WP, the display module DM, a driving circuit DC, and a housing HU. The window panel WP and the housing HU may be coupled to each other to provide an exterior of the display device DD. For example, the window panel WP and the house HU may form an enclosed space therebetween when coupled to each other.

The window panel WP may include an optically transparent insulating material. For example, the window panel WP may include a glass or plastic material. The front surface of the window panel WP may define the display surface FS of the display device DD as described above. The display surface FS may include a transmissive area TA and a bezel area BZA. The transmissive area TA may be an optically transparent area. For example, the transmissive area TA may be an area having a visible light transmittance of about 90% or more.

The bezel area BZA may be an area having a relatively lower transmittance than that of the transmissive area TA. The bezel area BZA may define a shape of the transmissive area TA. The bezel area BZA may be disposed adjacent to the transmissive area TA and may at least partially surround the transmissive area TA. The bezel area BZA may cover a peripheral area NAA of the display module DM to prevent the peripheral area NAA from being viewed from the outside. However, this is merely one example, and the bezel area BZA may be omitted from the window panel WP according to an embodiment of the present invention. The window panel WP may include at least one functional layer among an anti-fingerprint layer, a hard coating layer, and an anti-reflective layer, however, it should not be particularly limited.

The display module DM may display the image IM and may sense an external input. The display module DM may include a front surface IS in which an active area AA and the peripheral area NAA are provided. The active area AA may be an area that is activated in response to an electrical signal.

In the present embodiment, the active area AA may be an area through which the image IM is displayed and the external input is sensed. The transmissive area TA may overlap at least a portion of the active area AA. For example, the transmissive area TA may overlap an entire portion or at least a portion of the active area AA.

The peripheral area NAA may be covered by the bezel area BZA. The peripheral area NAA may be disposed adjacent to the active area AA. The peripheral area NAA may at least partially surround the active area AA. A driving circuit and/or a driving line to drive the active area AA may be disposed in the peripheral area NAA.

In the present embodiment, the display module DM may include a display panel 100, an input sensor 200, and a light control layer 300.

The display panel 100 may include configurations to generate the image IM. The image IM generated by the display panel 100 may be viewed from outside by the user through the transmissive area TA.

For example, the display panel 100 may be a light emitting type display panel, and as an example, the display panel 100 may be an organic light emitting display panel, an inorganic light emitting display panel, a micro-LED display panel, or a nano-LED display panel.

As shown in FIG. 2A, the display panel 100 may include a base layer 110, a circuit layer 120, a light emitting element layer 130, and an encapsulation layer 140.

The base layer 110 may provide a base surface on which the circuit layer 120 is disposed. The base layer 110 may be a flexible substrate that is foldable. The base layer 110 may be, for example, a glass substrate, a metal substrate, or a polymer substrate, however, the present invention should not be limited thereto or thereby. According to an embodiment of the present invention, the base layer 110 may be an inorganic layer, an organic layer, or a composite material layer.

As shown in FIG. 2B, the base layer 110 may have a multi-layer structure. The base layer 110 may include a first synthetic resin layer 111, a first inorganic layer 112 disposed on the first synthetic resin layer 111, a second synthetic resin layer 113 disposed on the first inorganic layer 112, and a second inorganic layer 114 disposed on the second synthetic resin layer 113. For example, each of the first and second synthetic resin layers 111 and 113 may include a polyimide-based resin, however, the present invention should not be particularly limited thereto. In addition, the multi-layer structure of the base layer 110 should not be limited thereto or thereby.

The circuit layer 120 may be disposed on the base layer 110. The circuit layer 120 may include an insulating layer, a semiconductor pattern, a conductive pattern, and a signal line. The circuit layer 120 may include a driving circuit of a pixel.

The light emitting element layer 130 may be disposed on the circuit layer 120. The light emitting element layer 130 may include a light emitting element. For example, the light emitting element may include an organic light emitting material, an inorganic light emitting material, an organic-inorganic light emitting material, a quantum dot, a quantum rod, a micro-LED, or a nano-LED.

The encapsulation layer 140 may be disposed on the light emitting element layer 130. The encapsulation layer 140 may protect the light emitting element layer 130 from moisture, oxygen, and a foreign substance such as dust particles. The encapsulation layer 140 may include at least one inorganic layer. The encapsulation layer 140 may include a stack structure in which an inorganic layer, an organic layer, and an inorganic layer are sequentially stacked on each other.

The input sensor 200 may be disposed on the display panel 100. The input sensor 200 may sense the external input applied thereto from the outside. As described above, the input sensor 200 may sense the external input applied to the window panel WP. The external input may include a variety of inputs provided from the outside of the display device DD. As an example, the external inputs may include a proximity input (e.g., hovering) applied when approaching close to or adjacent to the display device DD at a predetermined distance as well as a touch input by a part of the user's body (e.g., the user's hand) or an input device (e.g., a stylus pen). In addition, the external inputs may be provided in the form of force, pressure, light, etc., and the present invention should not be particularly limited.

The input sensor 200 may be formed on the display panel 100 through successive processes. For example, the input sensor 200 may be disposed directly on the display panel 100. In the present disclosure, the expression "a component A is disposed directly on a component B" means that no intervening elements are present between the component A and the component B. For instance, no adhesive layer is disposed between the input sensor 200 and the display panel 100.

Referring to FIG. 2A, the input sensor 200 may include a first insulating layer IL1, a first conductive layer CL1, a second insulating layer IL2, a second conductive layer CL2, and a third insulating layer IL3 sequentially stacked on each other. The first insulating layer IL1 may be disposed on the encapsulation layer 140. For example, the first insulating layer IL1 may be disposed directly on the encapsulation layer 140.

According to an embodiment of the present invention, the first insulating layer IL1 may be omitted. When the first insulating layer IL1 is omitted, the first conductive layer CL1 may be disposed on an insulating layer disposed at an uppermost position of the encapsulation layer 140.

According to an embodiment of the present invention, the third insulating layer IL3 may be omitted. When the third insulating layer IL3 is omitted, the second conductive layer CL2 may be in contact with the light control layer 300. This will be described in detail later.

Each of the first, second, and third insulating layers IL1, IL2, and IL3 may include an inorganic layer or an organic layer. For example, the inorganic layer may include at least one of silicon oxide, silicon nitride, or silicon oxynitride. For example, the organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin.

Each of the first and second conductive layers CL1 and CL2 may have a single-layer structure or a multi-layer structure of layers stacked in the third direction DR3. The conductive layer having the multi-layer structure may include two or more layers of transparent conductive layers and metal layers. The conductive layer having the multi-layer structure may include metal layers containing different metals from each other. The transparent conductive layer may include, for example, indium tin oxide (ITO), indium zinc oxide (IZO), zinc oxide (ZnO), indium tin zinc oxide (ITZO), PEDOT, metal nanowire, and/or graphene. The metal layer may include, for example, molybdenum, silver, titanium, copper, aluminum, or alloys thereof. The stack structure of each of the first conductive layer CL1 and the second conductive layer CL2 will be described in detail later.

The light control layer 300 may be disposed on the input sensor 200. The light control layer 300 may reduce a reflectance with respect to the external light. For example, the light control layer 300 may be disposed directly on the input sensor 200 through successive processes.

The light control layer 300 may include light blocking patterns overlapping a reflective structure disposed thereunder. The light control layer 300 may further include a color filter layer overlapping a light emitting area LA (refer to FIG. 4A) described later.

As shown in FIG. 1B, the driving circuit DC may be electrically connected to the display panel 100 and the input sensor 200. The driving circuit DC may include a main circuit board MB and a flexible circuit board CF.

The flexible circuit board CF may be electrically connected to the display panel 100. The flexible circuit board CF may connect the display panel 100 and the main circuit board MB to each other, however, this is merely one example. According to an embodiment of the present invention, the flexible circuit board CF might not be connected to the main circuit board MB, and the flexible circuit board CF may be a rigid substrate.

The flexible circuit board CF may be connected to pads (e.g., display pads) of the display panel 100, which are disposed in the peripheral area NAA of the display panel 100. The flexible circuit board CF may provide electrical signals to the display panel 100 to drive the display panel 100. The electrical signals may be generated by the flexible circuit board CF or the main circuit board MB.

The main circuit board MB may include various driving circuits, which drive the display module DM, and/or a connector to supply power. The main circuit board MB may be connected to the display module DM via the flexible circuit board CF.

The display panel 100 and the input sensor 200 of the display module DM may be controlled using one main circuit board MB, however, this is merely an example. According to an embodiment of the present invention, the display panel 100 and the input sensor 200 of the display module DM may be controlled using different main circuit boards.

The housing HU may be coupled with the window panel WP. The housing HU and the window panel WP coupled with the housing HU may provide a predetermined inner space. The display module DM and the driving circuit DC may be accommodated in the inner space.

The housing HU may include a material with a relatively high rigidity. For example, the housing HU may include a glass, plastic, or metal material or a plurality of frames and/or plates of combinations thereof. The housing HU may stably protect the components of the display device DD accommodated in the inner space from external impacts.

Figure 3A:
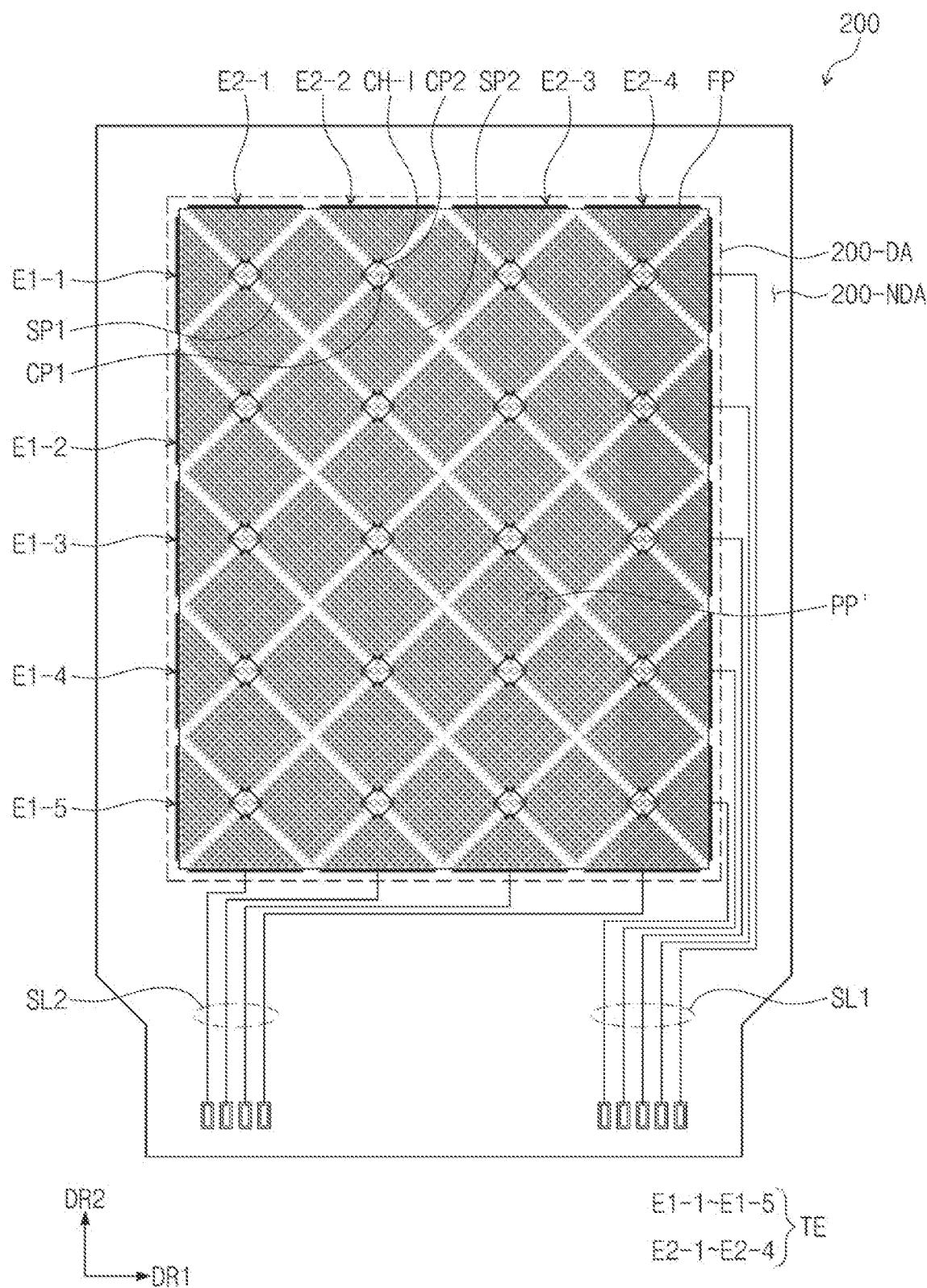
FIG. 3A is a plan view of an input sensor according to an embodiment of the present invention.
Figure 3B:
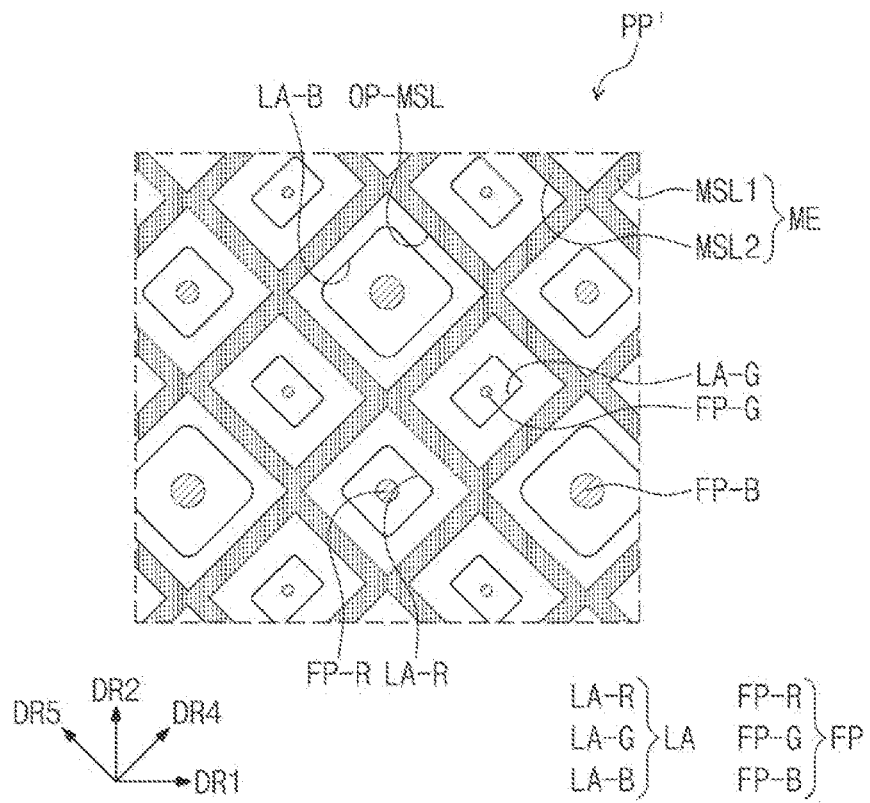
FIG. 3B is an enlarged plan view of an area PP' shown in FIG. 3A.
Figure 3C:
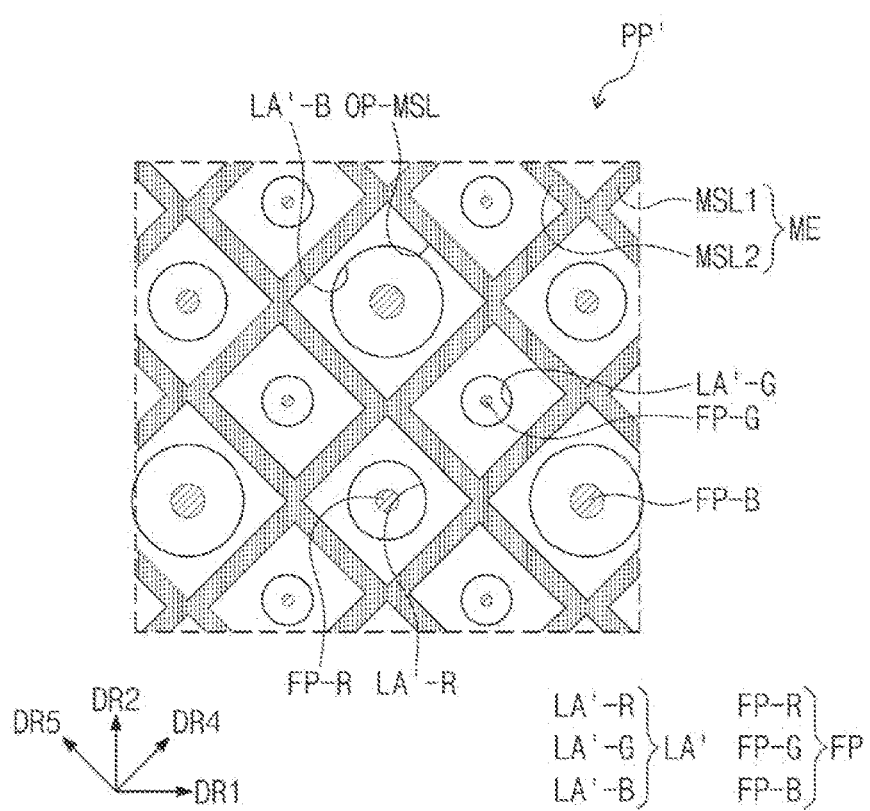
FIG. 3C is an enlarged plan view of an area PP' shown in FIG. 3A.

FIG. 3A is a plan view of the input sensor 200 according to an embodiment of the present invention. FIG. 3B is an enlarged plan view of an area PP' shown in FIG. 3A. FIG. 3C is an enlarged plan view of an area PP' shown in FIG. 3A.

Referring to FIG. 3A, the input sensor 200 may include sensing electrodes TE and floating patterns FP, which are disposed in a sensing area 200-DA of the input sensor 200, which may correspond with the active area AA. The sensing electrodes TE may include first electrodes E1-1 to E1-5 and second electrodes E2-1 to E2-4, which are insulated from each other while crossing each other.

The input sensor 200 may include first signal lines SL1 and second signal lines SL2. The first signal lines SL1 may be disposed in a non-sensing area 200-NDA of the input sensor 200, which may correspond with the peripheral area NAA, and may be electrically connected to the first electrodes E1-1 to E1-5. The second signal lines SL2 may be disposed in the non-sensing area 200-NDA and may be electrically connected to the second electrodes E2-1 to E2-4.

The first electrodes E1-1 to E1-5, the second electrodes E2-1 to E2-4, the first signal lines SL1, and the second signal lines SL2 may be formed by using a combination of the first conductive layer CL1 and the second conductive layer CL2 described with reference to FIG. 2A.

Each of the first electrodes E1-1 to E1-5 and the second electrodes E2-1 to E2-4 may include a plurality of conductive lines crossing each other.

Either the first electrodes E1-1 to E1-5 or the second electrodes E2-1 to E2-4 may be provided integrally. In the present embodiment, the first electrodes E1-1 to E1-5 are integrally provided.

The first electrodes E1-1 to E1-5 may include first sensing portions SP1 and first connection portions CP1. A portion of the second conductive layer CL2 described with reference to FIG. 2A may correspond to the first electrodes E1-1 to E1-5.

Each of the second electrodes E2-1 to E2-4 may include second sensing portions SP2 and second connection portions CP2. Two second sensing portions SP2 adjacent to each other may be connected to two second connection portions CP2 via a contact hole CH-I penetrating through the second insulating layer IL2 (refer to FIG. 2A), however, the number of the second connection portions CP2 should not be particularly limited. A portion of the second conductive layer CL2 described with reference to FIG. 2A may correspond to the second sensing portions SP2. A portion of the first conductive layer CL1 described with reference to FIG. 2A may correspond to the second connection portions CP2.

In the present embodiment, the second connection portions CP2 may be formed from the first conductive layer CL1, and the first electrodes E1-1 to E1-5 and the second sensing portions SP2 may be formed from the second conductive layer CL2, however, the present invention should not be limited thereto or thereby. According to an embodiment of the present invention, the first electrodes E1-1 to E1-5 and the second sensing portions SP2 may be formed from the first conductive layer CL1, and the second connection portions CP2 may be formed from the second conductive layer CL2.

Each of the floating patterns FP may be disposed spaced apart from the sensing electrodes TE. A portion of the second conductive layer CL2 described with reference to FIG. 2A may correspond to the floating patterns FP. The floating patterns FP might not be electrically connected to the first and second signal lines SL1 and SL2. The floating patterns FP might not be electrically connected to the sensing electrodes TE. A voltage might not be applied to the floating patterns FP. The floating patterns FP will be described in detail later.

One of the first signal lines SL1 and the second signal lines SL2 may receive a transmission signal from an external circuit to sense the external input, and the other one of the first signal lines SL1 and the second signal lines SL2 may apply a variation in capacitance between the first electrodes E1-1 to E1-5 and the second electrodes E2-1 to E2-4 to the external circuit as a reception signal.

A portion of the second conductive layer CL2 described with reference to FIG. 2A may correspond to the first signal lines SL1 and the second signal lines SL2. However, the present invention should not be limited thereto or thereby. The first signal lines SL1 and the second signal lines SL2 may have a multi-layer structure and may include a first layer line formed from the first conductive layer CL1 (refer to FIG. 2A) and a second layer line formed from the second conductive layer CL2 (refer to FIG. 2A). The first layer line and the second layer line may be connected to each other via a contact hole penetrating through the second insulating layer IL2 (refer to FIG. 2A).

FIGS. 3B and 3C show a relationship between the sensing electrodes TE (refer to FIG. 3A) and the light emitting areas LA-R, LA-G, and LA-B viewed in a direction facing the front surface of the display device DD (refer to FIG. 1A). FIGS. 3B and 3C are enlarged plan views showing a portion of sensing electrodes TE (refer to FIG. 3A) included in the second conductive layer CL2 (refer to FIG. 2A) among the sensing electrodes TE (refer to FIG. 3A).

In the present embodiment, each of the light emitting areas LA may be defined by a pixel opening OP-PDL of a pixel definition layer PDL described with reference to FIG. 4A. The light emitting areas LA-R, LA-G, and LA-B may include first, second, and third light emitting areas LA-R, LA-G, and LA-B providing lights having different colors from each other.

The first, second, and third light emitting areas LA-R, LA-G, and LA-B may have different sizes from each other when viewed in the plane. The size of the first light emitting area LA-R may be greater than the size of the second light emitting area LA-G and may be smaller than the size of the third light emitting area LA-B.

The first and third light emitting areas LA-R and LA-B may be alternately arranged with each other in the second direction DR2 when viewed in the plane. The second light emitting areas LA-G may be arranged in a pixel row different from a pixel row in which the first and third light emitting areas LA-R and LA-B are arranged. The second light emitting areas LA-G may be arranged in the same pixel row, and the pixel rows in which the second light emitting areas LA-G are arranged may be arranged in the second direction DR2.

The first and second light emitting areas LA-R and LA-G may be alternately arranged in a fourth direction DR4 corresponding to an oblique direction with respect to the first and second directions DR1 and DR2. The second and third light emitting areas LA-G and LA-B may be alternately arranged in the fourth direction DR4. However, the arrangement of the first, second, and third light emitting areas LA-R, LA-G, and LA-B should not be limited thereto or thereby.

As shown in FIG. 3B, each of the first, second, and third light emitting areas LA-R, LA-G, and LA-B may have a quadrangular shape such as a substantially rectangular shape or a substantially square shape. However, the shape of the first, second, and third light emitting areas LA-R, LA-G, and LA-B should not be particularly limited thereto. As an example, as shown in FIG. 3C, each of first, second, and third light emitting areas LA'-R, LA'-G, and LA'-B may have a circular shape.

The first, second, and third light emitting areas LA-R, LA-G, and LA-B may provide the lights having different colors from each other. As an example, a first color light provided from the first light emitting area LA-R may be a red light, a second color light provided from the second light emitting area LA-G may be a green light, and a third color light provided from the third light emitting area LA-B may be a blue light.

However, the present invention should not be limited thereto or thereby, and the first, second, and third colors may be selected as lights that generate a white light when combined. According to an embodiment of the present invention, the first, second, and third color lights may have the same color as each other.

The sensing electrodes TE (refer to FIG. 3A) may include mesh lines MSL1 and MSL2. The mesh lines MSL1 and MSL2 may include a first mesh line MSL1 and a second mesh line MSL2. The first mesh line MSL1 may extend in the fourth direction DR4, and the second mesh line MSL2 may cross the first mesh line MSL1 and may extend in a fifth direction DR5 crossing the fourth direction DR4.

According to the present embodiment, the first sensing portions SP1 (refer to FIG. 3A), the first connection portions CP1 (refer to FIG. 3A), and the second sensing portions SP2 (refer to FIG. 3A), which form the second conductive layer CL2 (refer to FIG. 2A), may include the mesh lines MSL1 and MSL2. In the present invention, the first sensing portions SP1, the first connection portions CP1, and the second sensing portions SP2 of the sensing electrodes TE may be referred to as mesh electrodes ME, and the second connection portions CP2 of the sensing electrodes TE may be referred to as bridge electrodes BE (refer to FIG. 4A).

Mesh openings OP-MSL may be provided through the mesh electrodes ME. Each of the mesh openings OP-MSL may overlap a corresponding light emitting area among the light emitting areas LA-R, LA-G, and LA-B. Each of the mesh openings OP-MSL may have a size greater than that of the corresponding light emitting area among the light emitting areas LA-R, LA-G, and LA-B, and the second sensing portions SP2 (refer to FIG. 3A) might not overlap the light emitting areas LA-R, LA-G, and LA-B.

The floating patterns FP may be respectively disposed in the mesh openings OP-MSL. The floating patterns FP may be surrounded by the mesh electrodes ME. Each of the floating patterns FP may overlap a corresponding light emitting area among the light emitting areas LA-R, LA-G, and LA-B.

The floating patterns FP may include a first floating pattern FP-R, a second floating pattern FP-G, and a third floating pattern FP-B. The first floating pattern FP1-R may be disposed in the mesh opening OP-MSL corresponding to the first light emitting area LA-R. The second floating pattern FP-G may be disposed in the mesh opening OP-MSL corresponding to the second light emitting area LA-G. The third floating pattern FP-B may be disposed in the mesh opening OP-MSL corresponding to the third light emitting area LA-B.

When viewed in the plane, the first floating pattern FP-R may have a size greater than a size of the second floating pattern FP-G and smaller than a size of the third floating pattern FP-B.

Figure 4A:
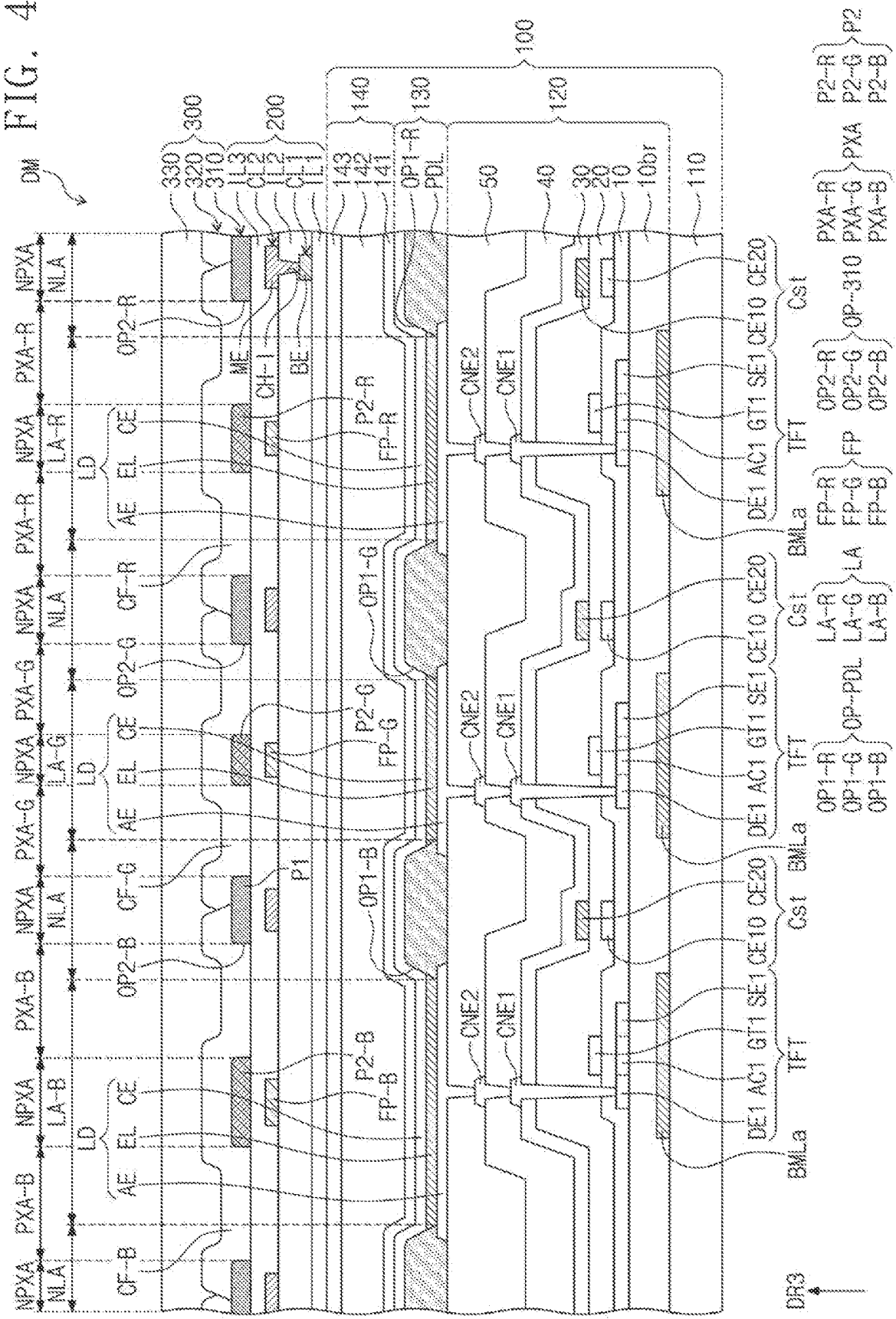
FIG. 4A is a cross-sectional view of a portion of a display module according to an embodiment of the present invention.
Figure 4B:
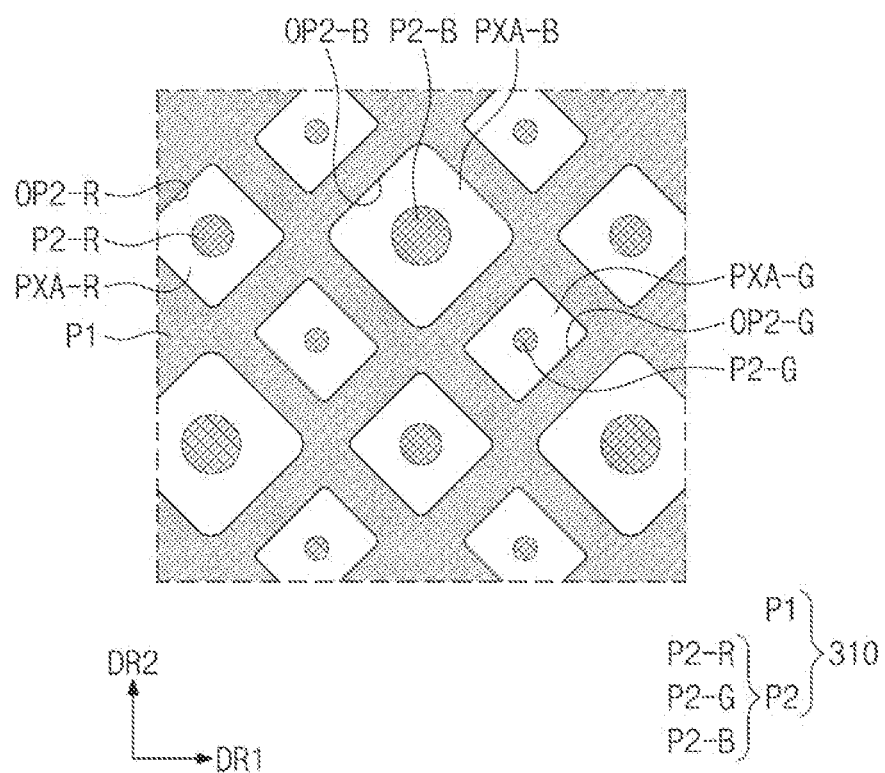
FIG. 4B is a plan view of a portion of a display module according to an embodiment of the present invention.

FIG. 4A is a cross-sectional view of a portion of the display module DM according to an embodiment of the present invention. FIG. 4B is a plan view of a portion of the display module according to an embodiment of the present invention. FIG. 4A shows a cross-section of one first light emitting area LA-R, one second light emitting area LA-G, and one third light emitting area LA-B, and a non-light-emitting area NLA, which are adjacent to each other. FIG. 4B is an enlarged plan view of a portion of a light blocking pattern 310 of the light control layer 300.

Referring to FIG. 4A, the display module DM may include the display panel 100, the input sensor 200, and the light control layer 300.

The display panel 100 may include the base layer 110, the circuit layer 120, the light emitting element layer 130, and the encapsulation layer 140. Detailed descriptions of the base layer 110 are the same as those described with reference to FIGS. 2A and 2B, and thus, they will be omitted.

The circuit layer 120 may include a buffer layer 10*br*, a rear surface metal layer BMLa, a transistor TFT, first, second, third, fourth, and fifth insulating layers 10, 20, 30, 40, and 50, a storage capacitor Cst, and first and second connection electrodes CNE1 and CNE2.

The buffer layer 10*br* may be disposed on the base layer 110. The buffer layer 10*br* may prevent metal atoms or impurities from being diffused upward to a semiconductor pattern from the base layer 110.

The rear surface metal layer BMLa may be disposed between the base layer 110 and the buffer layer 10*br*. The rear surface metal layer BMLa may be disposed under the transistor TFT and may prevent an external light from reaching the transistor TFT. For example, the rear surface metal layer BMLa may overlap the transistor TFT. According to an embodiment of the present invention, an inorganic barrier layer may be disposed between the rear surface metal layer BMLa and the buffer layer 10*br*. The rear surface metal layer BMLa may be connected to an electrode or a wire and may receive a constant voltage or a signal from the electrode or wire.

The semiconductor pattern may be disposed on the buffer layer 10*br*. The semiconductor pattern may include a silicon semiconductor. As an example, the silicon semiconductor may include amorphous silicon or polycrystalline silicon. For example, the semiconductor pattern may include low temperature polycrystalline silicon.

The semiconductor pattern may include a first region having a relatively high conductivity and a second region having a relatively low conductivity. The first region may be doped with an N-type dopant or a P-type dopant. A P-type transistor may include a doped region doped with the P-type dopant, and an N-type transistor may include a doped region doped with the N-type dopant. The second region may be a non-doped region or a region doped at a concentration lower than that of the first region.

The first region may have a conductivity greater than that of the second region and may substantially serve as an electrode or a signal line. The second region may substantially correspond to an active area (or a channel) of the transistor. For example, a portion of the semiconductor pattern may be the active area of the transistor, another portion of the semiconductor pattern may be a source area or a drain area of the transistor, and the other portion of the semiconductor pattern may be a connection electrode or a connection signal line.

The source area SE1 (or a source), the active area AC1 (or a channel), and the drain area DE1 (or a drain) of the transistor TFT may be formed from the semiconductor pattern. The source area SE1 and the drain area DE1 may extend in opposite directions to each other from the active area AC1 in a cross-section.

The first insulating layer 10 may be disposed on the buffer layer 10*br*. The first insulating layer 10 may commonly overlap the pixels and may cover the semiconductor pattern. The first insulating layer 10 may include an inorganic layer and/or an organic layer and may have a single-layer or multi-layer structure. The inorganic layer may include at least one of, for example, aluminum oxide, titanium oxide, silicon oxide, silicon nitride, silicon oxynitride, zirconium oxide, and/or hafnium oxide. In the present embodiment, the first insulating layer 10 may have a single-layer structure of a silicon oxide layer.

Not only the first insulating layer 10, but also the insulating layers 20 to 50 of the circuit layer 120 described later may be an inorganic layer and/or an organic layer and may have a single-layer or multi-layer structure. The inorganic layer may include at least one of the above-mentioned materials, however, the present invention should not be limited thereto or thereby.

A gate GT1 of the transistor TFT may be disposed on the first insulating layer 10. The gate GT1 may be a portion of a metal pattern. The gate GT1 may overlap the active area AC1. The gate GT1 may be used as a mask in a process of doping the semiconductor pattern.

The second insulating layer 20 may be disposed on the first insulating layer 10 and may cover the gate GT1. The third insulating layer 30 may be disposed on the second insulating layer 20.

The storage capacitor Cst may include a first electrode CE10 and a second electrode CE20. The first electrode CE10 may be disposed between the first insulating layer 10 and the second insulating layer 20. The second electrode CE20 may be disposed between the second insulating layer 20 and the third insulating layer 30.

The first connection electrode CNE1 may be disposed on the third insulating layer 30. The first connection electrode CNE1 may be connected to the drain area DE1 of the transistor TFT via a contact hole defined through the first, second, and third insulating layers 10, 20, and 30.

The fourth insulating layer 40 may be disposed on the third insulating layer 30. The second connection electrode CNE2 may be disposed on the fourth insulating layer 40. The second connection electrode CNE2 may be connected to the first connection electrode CNE1 via a contact hole penetrating through the fourth insulating layer 40. The fifth insulating layer 50 may be disposed on the fourth insulating layer 40 and may cover the second connection electrode CNE2. The stack structure of the first insulating layer 10 to the fifth insulating layer 50 is merely an example, and an additional conductive layer and an additional insulating layer may be disposed in addition to the first insulating layer 10 to fifth insulating layer 50.

Each of the fourth insulating layer 40 and the fifth insulating layer 50 may include an organic layer. As an example, the organic layer may include a general-purpose polymer such as benzocyclobutene (BCB), polyimide, hexamethyldisiloxane (HMDSO), polymethylmethacrylate (PMMA), or polystyrene (PS), a polymer derivative having a phenolic group, an acrylic-based polymer, an imide-based polymer, an aryl ether-based polymer, an amide-based polymer, a fluorine-based polymer, a p-xylene-based polymer, a vinyl alcohol-based polymer, or blends thereof.

The light emitting element layer 130 may include the light emitting element LD and the pixel definition layer PDL. The light emitting element LD may include a first electrode AE (or, e.g., a pixel electrode), a light emitting layer EL, and a second electrode CE (or, e.g., a common electrode). Each of the pixels may include the light emitting element LD and the transistor TFT.

The first electrode AE may be disposed on the fifth insulating layer 50. The first electrode AE may be a semi-transmissive electrode, a transmissive electrode, or a reflective electrode. According to an embodiment of the present invention, the first electrode AE may include a reflective layer formed of Ag, Mg, Al, Pt, Pd, Au, Ni, Nd, Ir, Cr, or compounds thereof and a transparent or semi-transparent electrode layer formed on the reflective layer. The transparent or semi-transparent electrode layer may include at least one of, for example, indium tin oxide (ITO), indium zinc oxide (IZO), indium gallium zinc oxide (IGZO), zinc oxide (ZnO), indium oxide (In2O3), and/or aluminum-doped zinc oxide (AZO). For instance, the first electrode AE may have a stack structure of ITO/Ag/ITO.

The pixel definition layer PDL may be disposed on the fifth insulating layer 50. According to an embodiment of the present invention, the pixel definition layer PDL may have a light absorbing property. For example, the pixel definition layer PDL may have a black color. The pixel definition layer PDL may include a black coloring agent. The black coloring agent may include a black dye or a black pigment. The black coloring agent may include a metal material, such as carbon black, chromium, or an oxide thereof. The pixel definition layer PDL may be a pattern with a light blocking property.

The pixel definition layer PDL may cover a portion of the first electrode AE. As an example, the pixel definition layer PDL may be provided with the pixel openings OP-PDL provided therethrough to expose at least a portion of the first electrode AE. Each pixel opening OP-PDL of the pixel definition layer PDL may define a corresponding light emitting area among the light emitting areas LA. The non-light-emitting area NLA may correspond to an area of the active area AA (refer to FIG. 1B) except the light emitting areas LA.

The pixel openings OP-PDL may include a first pixel opening OP1-R defining the first light emitting area LA-R, a second pixel opening OP1-G defining the second light emitting area LA-G, and a third pixel opening OP1-B defining the third light emitting area LA-B. When viewed in the plane, the first pixel opening OP1-R may have a size greater than a size of the second pixel opening OP1-G and smaller than a size of the third pixel opening OP1-B.

The light emitting layer EL may be disposed on the first electrode AE. The light emitting layer EL may be disposed in an area corresponding to each of the pixel openings OP-PDL. For example, the light emitting layer EL may be disposed to correspond to each of the light emitting areas LA.

The second electrode CE may be disposed on the light emitting layer EL. The second electrode CE may be commonly disposed over the light emitting areas LA and the non-light-emitting area NLA.

A hole control layer may be disposed between the first electrode AE and the light emitting layer EL. The hole control layer may include a hole transport layer and may further include a hole injection layer. An electron control layer may be further disposed between the light emitting layer EL and the second electrode CE. The electron control layer may include an electron transport layer and may further include an electron injection layer.

The encapsulation layer 140 may be disposed on the light emitting element layer 130. The encapsulation layer 140 may include an inorganic layer 141, an organic layer 142, and an inorganic layer 143, which are sequentially stacked on each other, however, layers included in the encapsulation layer 140 should not be limited thereto or thereby.

The inorganic layers 141 and 143 may protect the light emitting element layer 130 from moisture and oxygen, and the organic layer 142 may protect the light emitting element layer 130 from a foreign substance such as dust particles. For example, the inorganic layers 141 and 143 may include a silicon nitride layer, a silicon oxynitride layer, a silicon oxide layer, a titanium oxide layer, or an aluminum oxide layer. For example, the organic layer 142 may include an acrylic-based organic layer, however, the present invention should not be limited thereto or thereby.

The input sensor 200 may be disposed on the display panel 100. According to the present embodiment, the input sensor 200 may include the first insulating layer IL1, the first conductive layer CL1, the second insulating layer IL2, the second conductive layer CL2, and the third insulating layer IL3. FIG. 4A shows the bridge electrode BE of the sensing electrodes TE (refer to FIG. 3A) corresponding to portions of the first conductive layer CL1 and the mesh electrode ME. FIG. 4A also shows the floating patterns FP of the sensing electrodes TE (refer to FIG. 3A) corresponding to portions of the second conductive layer CL2.

The first insulating layer IL1 may be disposed on the encapsulation layer 140 of the display panel 100. The first insulating layer IL1 may be disposed to overlap the light emitting areas LA and the non-light-emitting area NLA.

The bridge electrode BE may be disposed on the first insulating layer IL1. The bridge electrode BE may overlap the pixel definition layer PDL. For example, the bridge electrode BE may overlap the non-light-emitting area NLA.

The second insulating layer IL2 may be disposed on the first insulating layer IL1. The second insulating layer IL2 may be disposed on the bridge electrode BE. The second insulating layer IL2 may be in contact with a portion of an upper surface and a side surface of the bridge electrode BE and may cover a portion of the bridge electrode BE.

The contact hole CH-I may penetrate through the second insulating layer IL2 by removing a portion the second insulating layer IL2 from an upper surface of the second insulating layer IL2 in a thickness direction. The portion of the upper surface of the bridge electrode BE may be exposed through the contact hole CH-I without being covered by the second insulating layer IL2.

The mesh electrode ME may be disposed on the second insulating layer IL2. The mesh electrode ME may overlap the pixel definition layer PDL. For example, the mesh electrode ME may overlap the non-light-emitting area NLA. The mesh electrode ME may be connected to the bridge electrode BE via the contact hole CH-I of the second insulating layer IL2.

The floating patterns FP may be disposed on the second insulating layer IL2. According to the present embodiment, the floating patterns FP may be disposed on the same layer as the mesh electrode ME.

Each of the floating patterns FP may overlap a corresponding pixel opening among the pixel openings OP-PDL. For example, each of the floating patterns FP may be disposed to overlap a corresponding light emitting area among the light emitting areas LA.

According to an embodiment of the present invention, the floating patterns FP may have a single-layer structure or a multi-layer structure of layers stacked in the third direction DR3. The conductive layer having the multi-layer structure may include metal layers containing different metal materials from each other.

According to an embodiment of the present invention, the floating patterns FP may include the metal material. As an example, the floating patterns FP may include Ti, Al, Mo, Cu, or the like. In the case where the floating patterns FP have the multi-layer structure, the floating patterns FP may have a stack structure corresponding to one of Ti/Al, Al/Mo, and Ti/Cu, however, materials for the floating patterns FP should not be limited thereto or thereby.

According to the present embodiment, the input sensor 200 may include the third insulating layer IL3. The third insulating layer IL3 may be disposed on the mesh electrode ME and the floating patterns FP. For example, the third insulating layer IL3 may be disposed on the second insulating layer IL2, may be in contact with an upper surface and a side surface of each of the mesh electrode ME and the floating patterns FP, and may entirely cover the mesh electrode ME and the floating patterns FP.

The light control layer 300 may be disposed on the input sensor 200. The light control layer 300 may include the light blocking patterns 310 (or, e.g., light absorbing patterns), the color filter layer 320, and a planarization layer 330.

In the present embodiment, the light blocking patterns 310 may be disposed on the third insulating layer IL3. The light blocking patterns 310 may include a first pattern P1 and second patterns P2.

The first pattern P1 may be disposed on the third insulating layer IL3. The first pattern P1 may overlap the pixel definition layer PDL. For example, the first pattern P1 may be disposed in the non-light-emitting area NLA. The first pattern P1 may overlap the mesh electrode ME and the bridge electrodes BE. For example, the first pattern P1 may entirely overlap the mesh electrode ME and the bridge electrodes BE.

The first pattern P1 may be provided with light blocking openings OP-310 (e.g., display openings) defined therethrough to respectively correspond to the pixel openings OP-PDL of the pixel definition layer PDL. FIG. 4A shows a structure in which a size of each of the pixel openings OP-PDL is smaller than a size of a corresponding light blocking opening among the light blocking openings OP-310, however, the size of each of the pixel openings OP-PDL and the size of the corresponding light blocking opening among the light blocking openings OP-310 should not be limited thereto or thereby. As an example, the size of the pixel openings OP-PDL may be the same as the size of the light blocking openings OP-310, or the size of the pixel openings OP-PDL may be greater than the size of the light blocking openings OP-310.

The light blocking openings OP-310 may be provided in three types. The light blocking openings OP-310 may include a first light blocking opening OP2-R corresponding to the first light emitting area LA-R, a second light blocking opening OP2-G corresponding to the second light emitting area LA-G, and a third light blocking opening OP2-B corresponding to the third light emitting area LA-B.

When viewed in the plane, the first light blocking opening OP2-R may have a size greater than a size of the second light blocking opening OP2-G and smaller than a size of the third light blocking opening OP2-B.

The second patterns P2 may be disposed on the third insulating layer IL3. Each of the second patterns P2 may overlap a corresponding pixel opening among the pixel openings OP-PDL. For example, each of the second patterns P2 may overlap a corresponding light emitting area among the light emitting areas LA. Each of the second patterns P2 may be spaced apart from the first pattern P1 and may be disposed in the corresponding light blocking opening of the light blocking openings OP-310.

The second patterns P2 may be provided in three types. The second patterns P2 may include a first sub-pattern P2-R disposed in the first light blocking opening OP2-R, a second sub-pattern P2-G disposed in the second light blocking opening OP2-G, and a third sub-pattern P2-B disposed in the third light blocking opening OP2-B. When viewed in the plane, the first sub-pattern P2-R may have a size greater than a size of the second sub-pattern P2-G and smaller than a size of the third sub-pattern P2-B.

As shown in FIG. 4B, each of the second patterns P2 may have a circular shape. However, the shape of the second patterns P2 should not be limited thereto or thereby and may be changed to suit characteristics such as a shape and an arrangement of the pixels.

The side surface of the light blocking patterns 310 may define pixel areas PXA. The pixel areas PXA may be areas between the side surface of the first pattern P1 and the side surface of the second pattern P2 facing the side surface of the first pattern P1. The pixel areas PXA may be areas from which the light generated by the light emitting element LD exits to the outside. Non-pixel areas NPXA may correspond to areas of the active area AA (refer to FIG. 1B) except the pixel areas PXA. Among the non-pixel areas NPXA, the non-pixel areas overlapping the light emitting area LA may respectively correspond to (e.g., overlap) areas in which the second patterns P2 are disposed. As a size of the pixel areas PXA increases, a brightness of images may increase.

A boundary of a first pixel area PXA-R may be defined by a side surface of the first pattern P1 that defines the first light blocking opening OP2-R and a side surface of the first sub-pattern P2-R disposed in the first light blocking opening OP2-R. A boundary of a second pixel area PXA-G may be defined by a side surface of the first pattern P1 that defines the second light blocking opening OP2-G and a side surface of the second sub-pattern P2-G disposed in the second light blocking opening OP2-G. A boundary of a third pixel area PXA-B may be defined by a side surface of the first pattern P1 that defines the third light blocking opening OP2-B and a side surface of the third sub-pattern P2-B disposed in the third light blocking opening OP2-B.

According to an embodiment of the present invention, each of the second patterns P2 may be disposed at a center of a corresponding light blocking opening among the light blocking openings OP-310. As an example, the second patterns P2 may be disposed such that a center of each of the second patterns P2 having the circular shape may coincide with a center of an area of the corresponding light blocking opening among the light blocking openings OP-310 when viewed in the plane.

Each of the second patterns P2 may provide the non-pixel area NPXA in which an emission of the light generated by the light emitting element LD is blocked. As the second patterns P2 are disposed at the center to provide the non-pixel area NPXA, the light provided from the light emitting element LD may be uniformly emitted, and the external light incident from the outside may be prevented from being concentrated in a portion within one pixel area PXA and emitted therefrom after being reflected. Accordingly, a visibility of the display device DD (refer to FIG. 1A) may be increased. However, a position of each of the second patterns P2 should not be limited thereto or thereby.

According to an embodiment of the present invention, the size of each of the second patterns P2 may be about 20% or more and about 50% or less of the size of the corresponding light blocking opening among the light blocking openings OP-310.

When the size of each of the second patterns P2 is smaller than about 20% of the size of the corresponding light blocking opening OP-310, a degree of reduction in reflection of the external light may be insufficient to increase the visibility of the display device DD (refer to FIG. 1A) since an amount of absorption of the external light incident toward the light blocking opening OP-310 is insignificant.

When the size of each of the second patterns P2 is greater than about 50% of the size of the corresponding light blocking opening OP-310, a light-emitting efficiency of the light provided from the light emitting element LD may be reduced since the size of each of the pixel areas PXA decreases. As a result, the visibility of the display device DD (refer to FIG. 1A) may be reduced.

Materials for the light blocking patterns 310 should not be particularly limited as long as the materials may absorb the light. For example, the light blocking patterns 310 may be light absorbing patterns that absorb the external light. The light blocking patterns 310 may include a black coloring agent. The black coloring agent may include a black dye or a black pigment. The black coloring agent may include a metal material, such as carbon black, chromium, or an oxide thereof. Therefore, the light blocking patterns 310 may have a black color.

Accordingly, the light blocking patterns 310 may absorb the external light incident to the display surface FS (refer to FIG. 1A) of the display device DD (refer to FIG. 1A) and may reduce the reflection of the external light. The first pattern P1 may prevent the external light from reaching the mesh electrodes ME and the bridge electrodes BE, and thus, may prevent the external light from being reflected by the mesh electrodes ME and the bridge electrodes BE.

According to the present invention, as each of the second patterns P2 is disposed in the corresponding light blocking opening OP-310 of the first pattern P1, a portion of the external light traveling to the corresponding light blocking opening OP-310 may be absorbed.

Accordingly, the second pattern P2 may reduce the amount of the external light that travels to the light emitting element LD after passing through the corresponding light blocking opening OP-310. Thus, an amount of the external light traveling to the outside after being reflected by the first electrode AE or the second electrode CE may be reduced, and as a result, the visibility of the display device DD (refer to FIG. 1A) may be increased.

According to the present invention, as each of the floating patterns FP may have a single-layer structure of a metal layer or a multi-layer structure of plural metal layers, the floating patterns FP may reflect a portion of the light generated by the light emitting element LD to the light emitting element LD. For example, each of the floating patterns FP may be a reflective pattern for the light generated by the light emitting element LD. The light reflected by each of the floating patterns FP may be reflected again by the first electrode AE and may be emitted to the outside through the light blocking opening OP-310.

Therefore, as the floating patterns FP are disposed under the second patterns P2, the portion of the light provided from the light emitting element LD may be prevented from being absorbed by the second patterns P2. In addition, the portion of the light provided from the light emitting element LD may be provided to the light emitting element LD after being reflected by the floating patterns FP, and the reflected light provided to the light emitting element LD may be emitted to the outside after being reflected again by the first electrode AE or the second electrode CE.

As the second patterns P2 define the non-pixel area NPXA overlapping the light emitting areas LA, a light-emitting efficiency of the display module DM with the second patterns P2 may be lower than a light-emitting efficiency of the display module DM without the second patterns P2. However, since the floating patterns FP are provided, the light-emitting efficiency may be prevented from being lowered due to the second patterns P2.

According to the present invention, each of the floating patterns FP may be disposed at the center of a corresponding pixel opening among the pixel openings OP-PDL. As an example, the floating patterns FP may be disposed such that a center of each of the floating patterns FP having a circular shape may coincide with the center of the area of the corresponding pixel opening OP-PDL when viewed in the plane. Accordingly, the light reflected by the floating patterns FP may be reflected back in a uniform distribution within the corresponding light emitting area PXA, and thus, the light may be uniformly emitted. However, a position of the floating patterns FP should not be limited thereto or thereby.

However, in a case where a variation in light-emitting efficiency of the display module DM with the second patterns P2 is insignificant according to the shape, size, or material of the second patterns P2 compared to the display module DM without second patterns P2, the floating patterns FP may be omitted.

The color filter layer 320 may be disposed on the third insulating layer IL3. The color filter layer 320 may be disposed to overlap the corresponding light blocking opening OP-310 of the light blocking patterns 310.

The color filter layer 320 may include three types of color filters CF-R, CF-G, and CF-B. The color filter layer 320 may include a first color filter CF-R overlapping the first light blocking opening OP2-R, a second color filter CF-G overlapping the second light blocking opening OP2-G, and a third color filter CF-B overlapping the third light blocking opening OP2-B.

The first color filter CF-R may cover at least a portion of the first pattern P1 adjacent to the first pixel area PXA-R and an entire portion of the first sub-pattern P2-R. The second color filter CF-G may cover at least a portion of the first pattern P1 adjacent to the second pixel area PXA-G and an entire portion of the second sub-pattern P2-G. The third color filter CF-B may cover at least a portion of the first pattern P1 adjacent to the third pixel area PXA-B and an entire portion of the third sub-pattern P2-B.

The color filter layer 320 may transmit the light generated by the light emitting element LD and may block some wavelengths of the external light. Accordingly, the color filter layer 320 may decrease the reflection of the external light by the first electrode AE or the second electrode CE.

The planarization layer 330 may cover the light blocking patterns 310 and the color filter layer 320. The planarization layer 330 may include an organic material, and the planarization layer 330 may provide a flat upper surface thereon.

Figure 5:
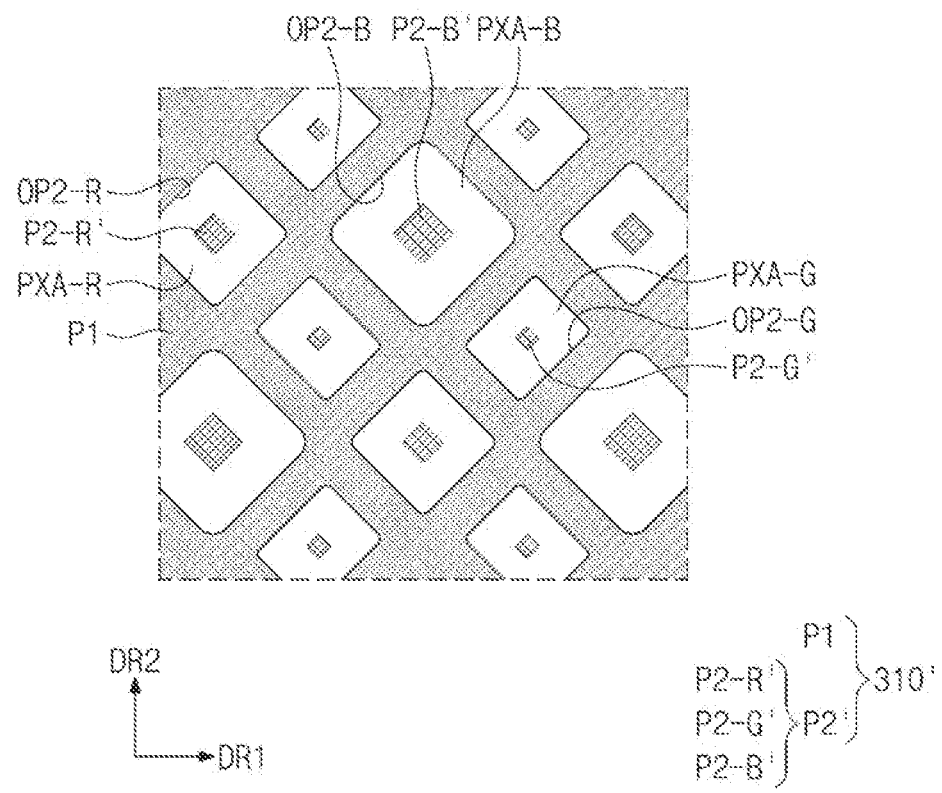
FIG. 5 is a plan view of a portion of a display module according to an embodiment of the present invention.

Referring to FIG. 5, light blocking patterns 310' may include a first pattern P1 and second patterns P2'. First, second, and third light blocking openings OP2-R, OP2-G, and OP2-B may be provided in the first pattern P1 to respectively define first, second, and third pixel areas PXA-R, PXA-G, and PXA-B. Each of second patterns P2' may be spaced apart from the first pattern P1 and may be disposed in a corresponding pixel area among the pixel areas PXA-R, PXA-G, and PXA-B.

According to the present embodiment, each of the second patterns P2' may have a lozenge shape. According to an embodiment of the present invention, each of the second patterns P2' may have a quadrangular shape rather than the lozenge shape or may have a polygonal shape except the quadrangular shape and the lozenge shape. For example, the shape of the second patterns P2' may be changed in various ways to be suitable for the absorption of the external light.

When viewed in a plane, the second patterns P2' may be disposed such that a center of the area of the second patterns P2' having the polygonal shape may coincide with a center of the area of the light blocking opening OP-310. However, positions of the second patterns P2' should not be limited thereto or thereby.

Figure 6:
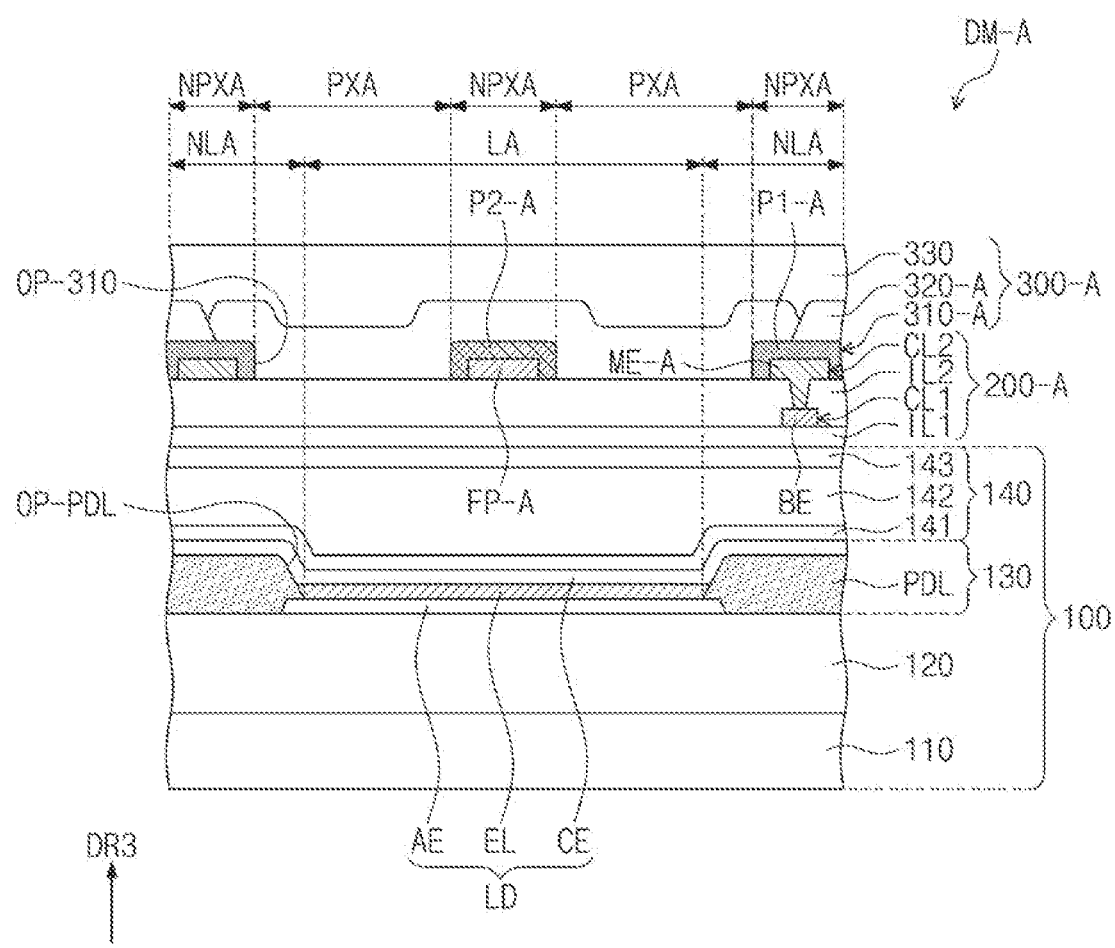
FIG. 6 is a cross-sectional view of a portion of a display module according to an embodiment of the present invention.

FIG. 6 is a cross-sectional view of a portion of a display module DM-A according to an embodiment of the present invention. FIG. 6 shows a cross-section of the display module DM-A corresponding to one light emitting area LA among the first, second, and third light emitting areas LA-R, LA-G, and LA-B shown in FIG. 4A. In FIG. 6, the same/similar reference numerals denote the same/similar elements in FIGS. 1A to 5, and thus, detailed descriptions of the same elements will be omitted to prevent redundant descriptions.

A floating pattern FP-A shown in FIG. 6 may correspond to one of the first, second, and third floating patterns FA-R, FA-G, and FA-B shown in FIG. 4A, and a second pattern P2-A shown in FIG. 6 may correspond to one of the first, second, and third sub-patterns P2-R, P2-G, and P2-B shown in FIG. 4A.

In FIG. 6, components of a circuit layer 120 of a display panel 100 are not illustrated in detail, and the circuit layer 120 is shown as a single layer as an example. The configurations of the circuit layer 120 and their stacking relationship are the same as those described with reference to FIG. 4A.

Referring to FIG. 6, the display module DM-A may include the display panel 100, an input sensor 200-A, and a light control layer 300-A. The input sensor 200-A may include a first insulating layer IL1, a bridge electrode BE, a second insulating layer IL2, a mesh electrode ME-A, and the floating pattern FP-A.

The first insulating layer IL1 may be disposed on an encapsulation layer 140. The bridge electrode BE may be disposed between the first insulating layer IL1 and the second insulating layer IL2. The second insulating layer IL2 may be disposed on the first insulating layer IL1. The mesh electrode ME-A and the floating pattern FP-A may be disposed on the second insulating layer IL2.

The light control layer 300-A may include light blocking patterns 310-A, a color filter layer 320-A, and a planarization layer 330. The light blocking patterns 310-A may include a first pattern P1-A and a second pattern P2-A.

The first pattern P1-A may be disposed on the second insulating layer IL2, and may cover the mesh electrode ME-A. For example, the first pattern P1-A may be in contact with an upper surface and a side surface of the mesh electrode ME-A. The second pattern P2-A may be disposed on the second insulating layer IL2, and may cover the floating pattern FP-A. For example, the second pattern P2-A may be in contact with an upper surface and a side surface of the floating pattern FP-A.

The color filter layer 320-A may be disposed on the second insulating layer IL2 and may overlap a corresponding light blocking opening among light blocking openings OP-310 of the first pattern P1-A. The color filter layer 320-A may be disposed on the first pattern P1-A and the second pattern P2-A. For example, the color filter layer 320-A may be in contact with an upper surface and at least one side surface of the second pattern P2-A and may cover the second pattern P2-A. As another example, the color filter layer 320-A may be in contact with an upper surface and at least one side surface of the first pattern P1-A and may cover the first pattern P1-A.

Figure 7A:
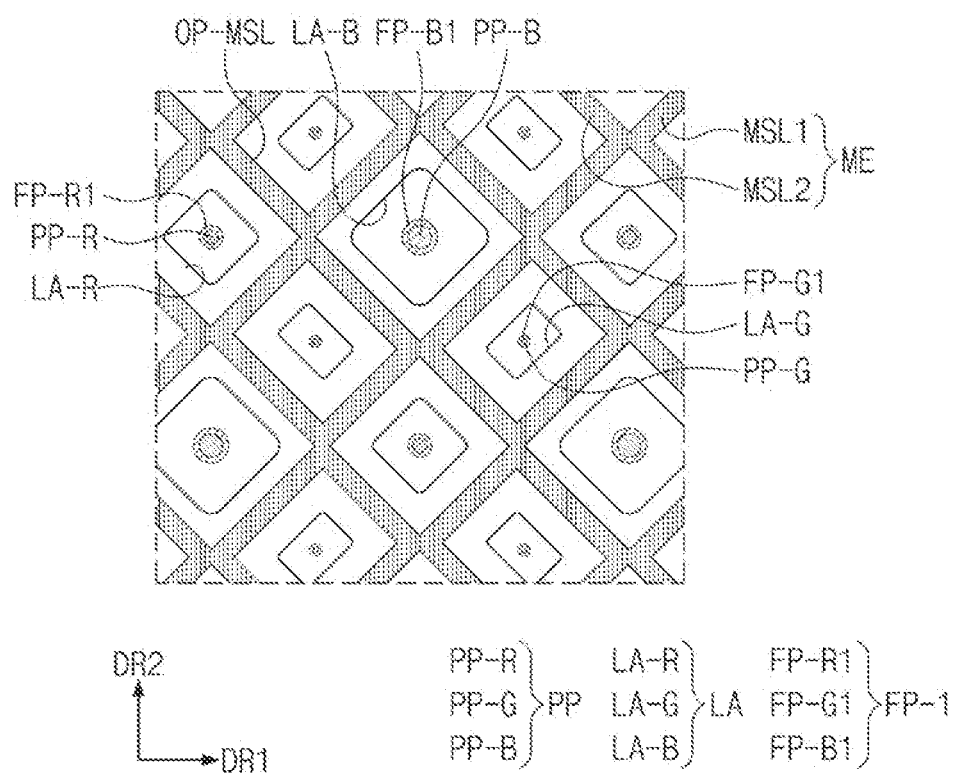
FIG. 7A is a plan view of a portion of a display module according to an embodiment of the present invention.
Figure 7B:
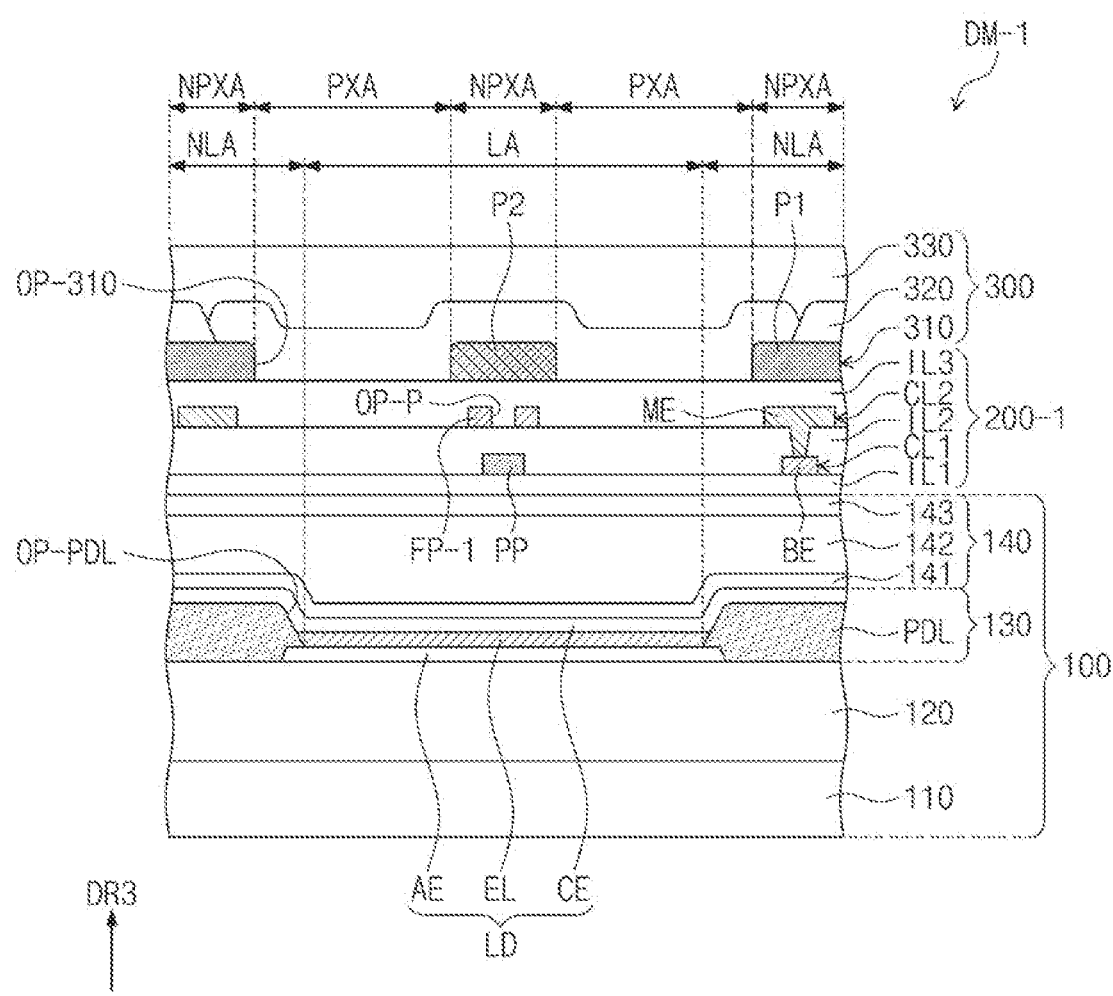
FIG. 7B is a cross-sectional view of a portion of a display module according to an embodiment of the present invention.
Figure 8:
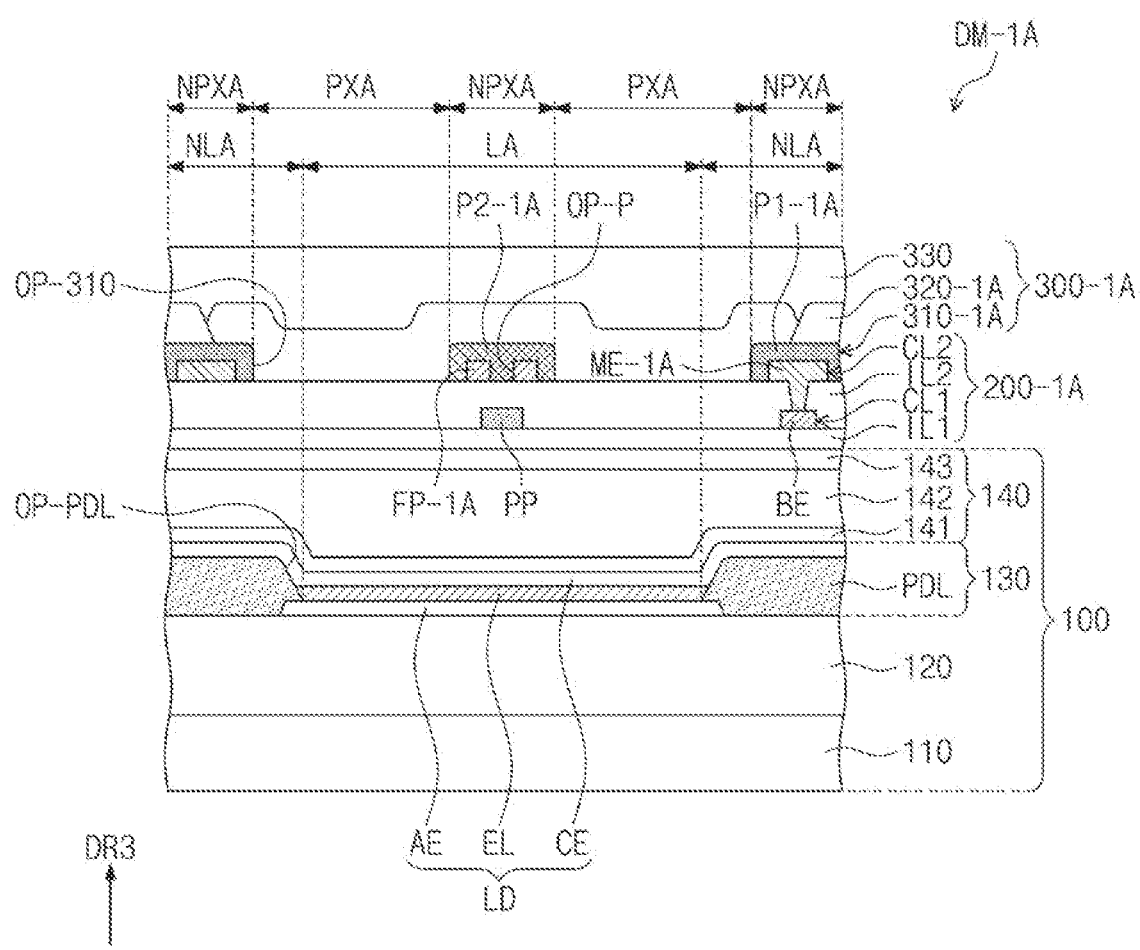
FIG. 8 is a cross-sectional view of a portion of a display module according to an embodiment of the present invention.

FIG. 7A is a plan view of a portion of a display module according to an embodiment of the present invention. FIG. 7B is a cross-sectional view of a portion of the display module DM-1 according to an embodiment of the present invention. FIG. 8 is a cross-sectional view of a portion of a display module DM-1A according to an embodiment of the present invention.

FIG. 7A shows a portion of the display module DM-1 corresponding to the area PP' shown in FIG. 3A and shows a relationship between sensing electrodes TE (refer to FIG. 3A) and light emitting areas LA-R, LA-G, and LA-B viewed in the direction facing the front surface of the display device DD (refer to FIG. 1A). In FIGS. 7A and 7B, the same/similar reference numerals denote the same/similar elements in FIGS. 1A to 6, and thus, detailed descriptions of the same/similar elements will be omitted to prevent redundant descriptions.

Referring to FIGS. 7A and 7B, the display module DM-1 may include a display panel 100, an input sensor 200-1, and a light control layer 300.

The input sensor 200-1 may include a first insulating layer IL1, a bridge electrode BE, an additional floating pattern PP, a second insulating layer IL2, a mesh electrode ME, a floating pattern FP-1, and a third insulating layer IL3. The input sensor 200-1 may further include the additional floating pattern PP.

The additional floating pattern PP may be disposed on the first insulating layer IL1. The additional floating pattern PP may overlap a pixel opening OP-PDL. For example, the additional floating pattern PP may overlap a corresponding light emitting area LA. The additional floating pattern PP may have a circular shape when viewed in a plane.

The second insulating layer IL2 may be disposed on the first insulating layer IL1 and may cover the bridge electrode BE and the additional floating pattern PP.

The mesh electrode ME may be disposed on the second insulating layer IL2. The floating pattern FP-1 may be disposed on the second insulating layer IL2. According to the present embodiment, the floating pattern FP-1 may be provided with a pattern opening OP-P defined therethrough. The pattern opening OP-P may have a circular shape when viewed in the plane. In this case, the floating pattern FP-1 may have annular shape. The pattern opening OP-P may overlap the additional floating pattern PP.

However, the shape of each of the additional floating pattern PP and the pattern opening OP-P in the plane should not be limited thereto or thereby, and each of the additional floating pattern PP and the pattern opening OP-P may have, for example, a polygonal shape in the plane.

The third insulating layer IL3 may be disposed on the second insulating layer IL2 and may cover the mesh electrode ME and the floating pattern FP-1. The third insulating layer IL3 may be disposed on the floating pattern FP-1 and in the pattern opening OP-P. For example, the third insulating layer IL3 may be in contact with an upper surface, a side surface, and an inner side surface, which defines the pattern opening OP-P, of the floating pattern FP-1.

The light control layer 300 may include light blocking patterns 310, a color filter layer 320, and a planarization layer 330.

The light blocking pattern 310 may be disposed on the third insulating layer IL3. The light blocking pattern 310 may include a first pattern P1 and a second pattern P2. The first pattern P1 overlaps the mesh electrode ME, and the second pattern P2 overlaps the additional floating pattern PP and the floating pattern FP-1. For example, the first pattern P1 may entirely overlap the mesh electrode ME, and the second pattern P2 may entirely overlap the additional floating pattern PP and the floating pattern FP-1.

Referring to FIG. 8, the display module DM-1A may include a display panel 100, an input sensor 200-1A, and a light control layer 300-1A. The input sensor 200-1A may include a first insulating layer IL1, a bridge electrode BE, an additional floating pattern PP, a second insulating layer IL2, a mesh electrode ME-1A, and a floating pattern FP-1A. Different from FIG. 7B, the input sensor 200-1A might not include the third insulating layer IL3 (refer to FIG. 7B). In FIG. 8, the same/similar reference numerals denote the same/similar elements in FIGS. 1A to 7B, and thus, detailed descriptions of the same/similar elements will be omitted to prevent redundant descriptions.

The light control layer 300-1A may include light blocking patterns 310-1A, a color filter layer 320-1A, and a planarization layer 330. The light blocking patterns 310-1A may include a first pattern P1-1A and a second pattern P2-1A.

According to the present embodiment, the first pattern P1-1A may be disposed on the second insulating layer IL2, may overlap an upper surface and a side surface of the mesh electrode ME-1A, and may cover the mesh electrode ME-1A. For example, the first pattern P1-1A may be in contact with the upper surface and the side surface of the mesh electrode ME-1A. The second pattern P2-1A may be disposed on the second insulating layer IL2, may overlap an upper surface, a side surface, and an inner side surface, which defines a pattern opening OP-P, of the floating pattern FP-1A, and may cover the floating pattern FP-1A. For example, second pattern P2-1A may be in contact with the upper surface, the side surface, and the inner side surface of the floating pattern FP-1A.

Figure 9:
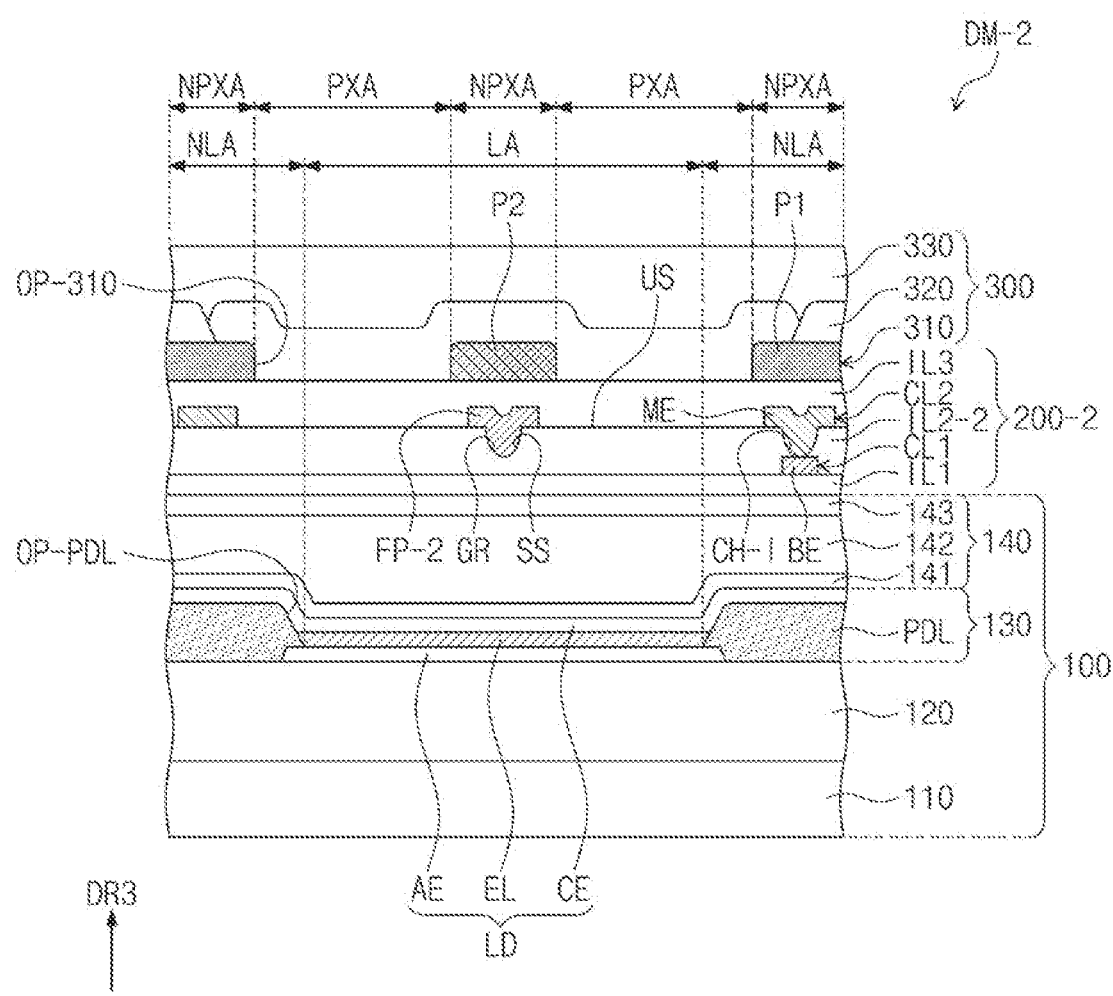
FIG. 9 is a cross-sectional view of a portion of a display module according to an embodiment of the present disclosure.
Figure 10:
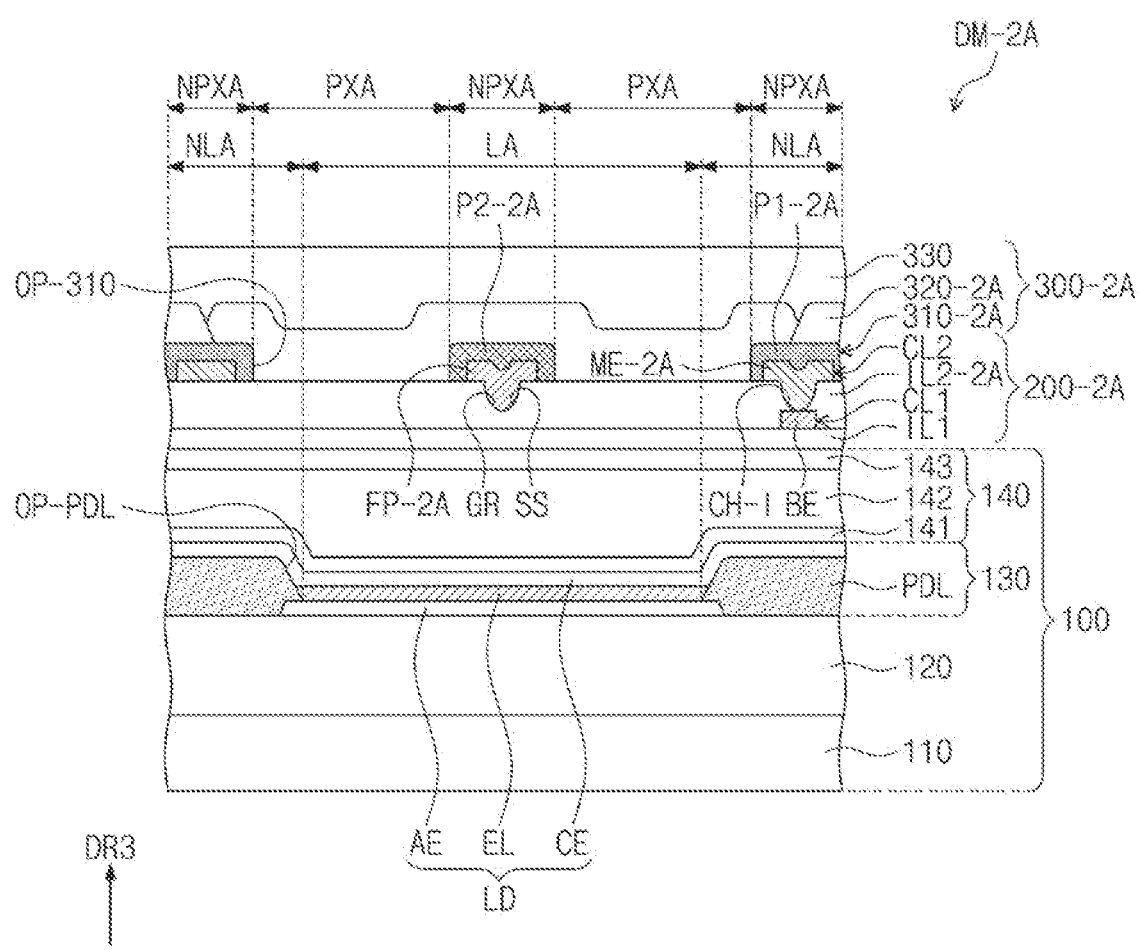
FIG. 10 is a cross-sectional view of a portion of a display module according to an embodiment of the present invention.

FIG. 9 is a cross-sectional view of a portion of a display module DM-2 according to an embodiment of the present invention. FIG. 10 is a cross-sectional view of a portion of a display module DM-2A according to an embodiment of the present invention. In FIGS. 9 and 10, the same/similar reference numerals denote the same/similar elements in FIGS. 1A to 6, and thus, detailed descriptions of the same/similar elements will be omitted to prevent redundant descriptions.

Referring to FIG. 9, the display module DM-2 may include a display panel 100, an input sensor 200-2, and a light control layer 300.

The input sensor 200-2 may include a first insulating layer IL1, a bridge electrode BE, a second insulating layer IL2-2, a mesh electrode ME, a floating pattern FP-2, and a third insulating layer IL3.

According to the present embodiment, a groove GR may be formed in the second insulating layer IL2-2 by removing a portion of the second insulating layer IL2-2 from an upper surface US of the second insulating layer IL2-2. The groove GR may overlap a pixel opening OP-PDL.

According to an embodiment of the present invention, an inner side surface SS of the groove GR of the second insulating layer IL2-2 may have a curvature.

According to an embodiment of the present invention, the groove GR may be formed through the same process as that used to form a contact hole CH-I. As an example, the inner side surface SS of the groove GR of the second insulating layer IL2-2 may have substantially the same shape as that of the inner side surface SS of the contact hole CH-I of the second insulating layer IL2-2. However, the process of forming the groove GR should not be limited thereto or thereby, and the groove GR may be formed through a process separately from the process used to form the contact hole CH-I.

The floating pattern FP-2 may be disposed on the second insulating layer IL2-2. The floating pattern FP-2 may cover the inner side surface SS of the grove GR of the second insulating layer IL2-2. For example, the floating pattern FP-2 may be disposed in the groove GR. A lower surface of the floating pattern FP-2, which is in contact with the groove GR, may have a curvature corresponding to that of the inner side surface SS of the groove GR.

According to the present embodiment, as the lower surface of the floating pattern FP-2 has a curved shape, a light generated by a light emitting element LD may be prevented from being provided to the floating pattern FP-2 at an incident angle of about 90 degrees. Accordingly, the light generated by the light emitting element LD may be prevented from being repeatedly reflected between the floating pattern FP-2 and a first electrode AE or between the floating pattern FP-2 and a second electrode CE, and thus, a light-emitting efficiency of the display module DM-2 may be prevented from being reduced.

A portion of an upper surface of the floating pattern FP-2 may be concave, however, the present invention should not be limited thereto or thereby. According to an embodiment of the present invention, the upper surface of the floating pattern FP-2 may be flat.

The third insulating layer IL3 may be disposed on the second insulating layer IL2-2 and may cover the mesh electrode ME and the floating pattern FP-2.

The light control layer 300 may include light blocking patterns 310, a color filter layer 320, and a planarization layer 330. The light blocking patterns 310 may be disposed on the third insulating layer IL3. The light blocking patterns 310 may include a first pattern P1 and a second pattern P2. The first pattern P1 entirely overlaps the mesh electrode ME, and the second pattern P2 entirely overlaps the floating pattern FP-2.

Referring to FIG. 10, the display module DM-2A may include a display panel 100, an input sensor 200-2A, and a light control layer 300-2A. The input sensor 200-2A may include a first insulating layer IL1, a bridge electrode BE, a second insulating layer IL2-2A, a mesh electrode ME-2A, and a floating pattern FP-2A. Different from FIG. 9, the input sensor 200-2A might not include the third insulating layer IL3 (refer to FIG. 9). In FIG. 10, the same/similar reference numerals denote the same elements in FIGS. 1A to 6 and 9, and thus, detailed descriptions of the same elements will be omitted to prevent redundant descriptions.

The light control layer 300-2A may include light blocking patterns 310-2A, a color filter layer 320-2A, and a planarization layer 330. The light blocking patterns 310-2A may include a first pattern P1-2A and a second pattern P2-2A.

According to the present embodiment, the first pattern P1-2A may be disposed on the second insulating layer IL2-2A, may be disposed on an upper surface and a side surface of the mesh electrode ME-2A, and may cover the mesh electrode ME-2A. For example, the first pattern P1-2A may be in contact with the upper surface and the side surface of the mesh electrode ME-2A. The second pattern P2-2A may be disposed on the second insulating layer IL2-2A, may be disposed on an upper surface and a side surface of the floating pattern FP-2A, and may cover the floating pattern FP-2A. For example, second pattern P2-1A may be in contact with the upper surface and the side surface of the floating pattern FP-2A.

Figure 11:
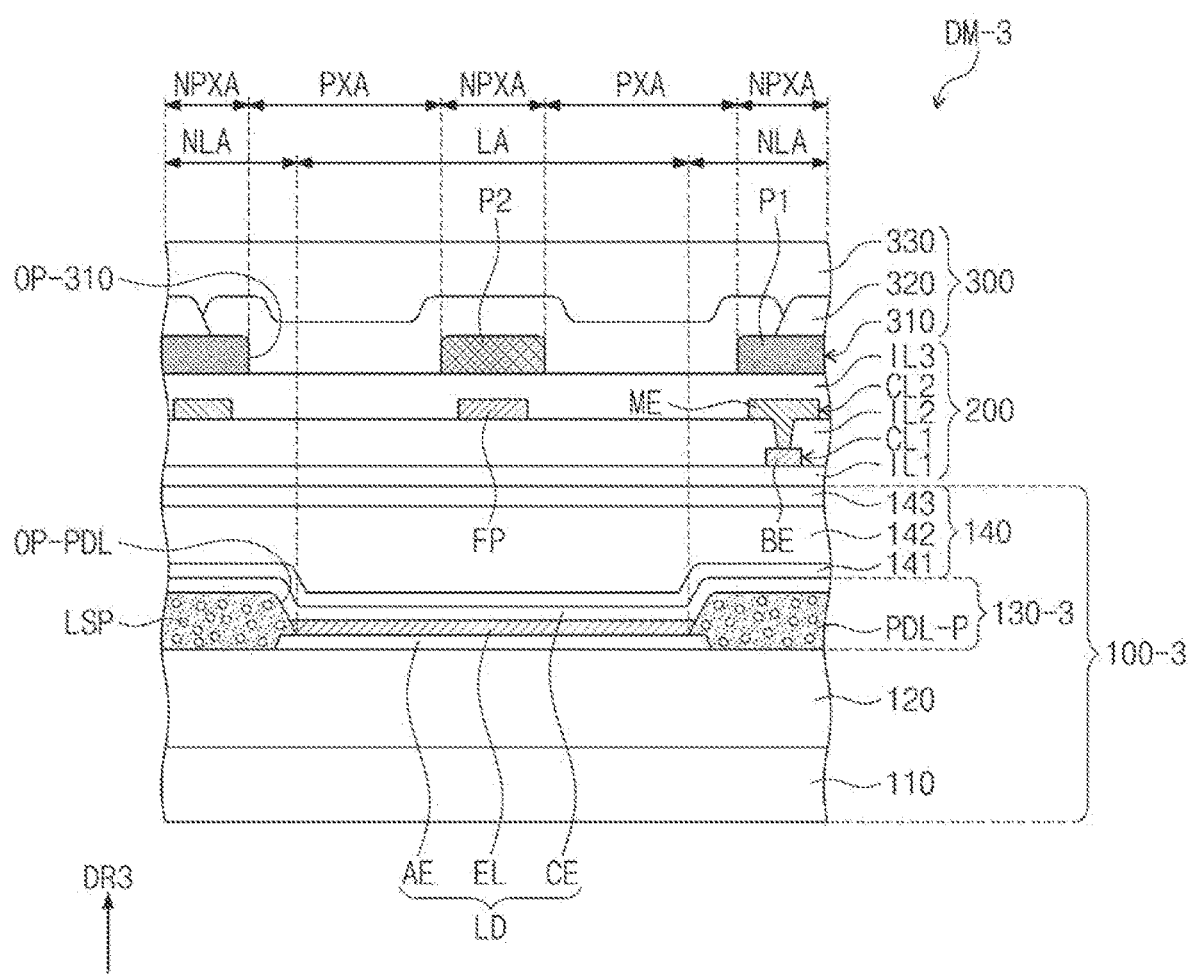
FIG. 11 is a cross-sectional view of a portion of a display module according to an embodiment of the present invention.

FIG. 11 is a cross-sectional view of a portion of a display module DM-3 according to an embodiment of the present invention. In FIG. 11, the same/similar reference numerals denote the same/similar elements in FIGS. 1A to 10, and thus, detailed descriptions of the same/similar elements will be omitted to prevent redundant descriptions.

Referring to FIG. 11, the display module DM-3 may include a display panel 100-3, an input sensor 200, and a light control layer 300.

The display panel 100-3 may include a base layer 110, a circuit layer 120, a light emitting element layer 130-3, and an encapsulation layer 140. The light emitting element layer 130-3 may include a light emitting element LD and a pixel definition layer PDL-P.

The pixel definition layer PDL-P may further include light scattering particles LSP. As an example, the light scattering particles may be metal oxide particles such as $TiO_2$ particles or $ZrO_x$ particles. As a light reflected by a first electrode AE and traveling toward the pixel definition layer PDL-P or a light reflected by floating patterns FP and traveling toward the pixel definition layer PDL-P collide with the light scattering particles LSP, a light path of the light may be changed, and thus, the light may be emitted to the outside through a light blocking opening OP-310. Accordingly, the pixel definition layer PDL-P including the light scattering particles LSP may increase a light-emitting efficiency of the display module DM-3.

While the present invention has been described with reference to embodiments thereof, it will be understood by those of ordinary skill in the art that various changes in form and details may be made thereto without departing from the spirit and scope of the present invention.

What is claimed is:

1. A display device comprising:
   a display panel comprising a light emitting element and a pixel definition layer including a pixel opening;
   an input sensor disposed on the display panel and comprising at least one insulating layer, a sensing electrode overlapping the pixel definition layer, and a floating pattern overlapping the pixel opening; and
   a light control layer disposed on the input sensor and comprising a light blocking pattern and a color filter, wherein the light blocking pattern comprises a first pattern and a second pattern, wherein the first pattern is includes a light blocking opening corresponding to the pixel opening, wherein the second pattern is spaced apart from the first pattern, is disposed in the light blocking opening, and overlaps the floating pattern, and wherein the color filter overlaps the light blocking opening.

2. The display device of claim 1, wherein the at least one insulating layer comprises a first insulating layer and a second insulating layer disposed on the first insulating layer, wherein the sensing electrode comprises a bridge electrode and a mesh electrode, wherein the bridge electrode is disposed between the first insulating layer and the second insulating layer, wherein the mesh electrode is disposed on the second insulating layer and includes a mesh opening corresponding to the pixel opening, and wherein the floating pattern is disposed on the second insulating layer, is spaced apart from the mesh electrode, and is disposed in the mesh opening.

3. The display device of claim 2, wherein the at least one insulating layer further comprises a third insulating layer disposed on the second insulating layer and covering the mesh electrode and the floating pattern, and the second pattern is disposed on the third insulating layer.

4. The display device of claim 2, wherein the first pattern is disposed on the second insulating layer and overlaps the mesh electrode, and the second pattern is disposed on the second insulating layer.

5. The display device of claim 2, wherein the input sensor further comprises an additional floating pattern disposed between the first insulating layer and the second insulating layer and overlapping the second pattern.

6. The display device of claim 5, wherein the floating pattern includes a floating opening, and the additional floating pattern overlaps the floating opening.

7. The display device of claim 6, wherein each of the floating opening and the additional floating pattern has a circular shape or a polygonal shape.

8. The display device of claim 5, wherein the at least one insulating layer further comprises a third insulating layer disposed on the second insulating layer and covering the mesh electrode and the floating pattern, and the second pattern is disposed on the third insulating layer.

9. The display device of claim 5, wherein the first pattern is disposed on the second insulating layer and covers the mesh electrode, and the second pattern is disposed on the second insulating layer and covers the floating pattern.

10. The display device of claim 2, wherein the second insulating layer includes a groove removing a portion of the second insulating layer from an upper surface of the second insulating layer along a thickness direction of the second insulating layer, and the floating pattern covers the groove.

11. The display device of claim 10, wherein an inner side surface of the groove of the second insulating layer has a curvature.

12. The display device of claim 10, wherein the at least one insulating layer further comprises a third insulating layer disposed on the second insulating layer and covering the mesh electrode and the floating pattern, and the second pattern is disposed on the third insulating layer.

13. The display device of claim 10, wherein the first pattern is disposed on the second insulating layer, is in contact with the mesh electrode, and covers the mesh electrode, and the second pattern is disposed on the second insulating layer, is in contact with the floating pattern, and covers the floating pattern.

14. The display device of claim 1, wherein the second pattern has a circular shape or a polygonal shape.

15. The display device of claim 1, wherein the floating pattern comprises a metal material.

16. The display device of claim 1, wherein the pixel definition layer has a black color and comprises a light scattering particle.

17. The display device of claim 1, wherein the pixel opening is a plurality of pixel openings comprising first, second, and third pixel openings, wherein the first pixel opening has a size greater than a size of the second pixel opening and smaller than a size of the third pixel opening, wherein the second pattern comprises first, second, and third sub-patterns respectively overlapping the first, second, and third pixel openings, and the first sub-pattern has a size greater than a size of the second sub-pattern and smaller than a size of the third sub-pattern.

18. The display device of claim 1, wherein the floating pattern is electrically insulated from the sensing electrode.

19. A display device comprising:
- a display panel comprising a light emitting area and a non-light-emitting area;
- an input sensor disposed on the display panel and comprising a sensing electrode and a reflective pattern, wherein the sensing electrode overlaps the non-light-emitting area, and the reflective pattern overlaps the light emitting area; and
- a light control layer disposed on the input sensor and comprising a light blocking pattern comprising a first pattern, a second pattern and a color filter, wherein the first pattern overlaps the non-light-emitting area, wherein the second pattern is spaced apart from the first pattern and overlaps the reflective pattern, and wherein the color filter overlaps the light emitting area and the non-light-emitting area.

20. A display device comprising:
- a display panel comprising a light emitting element and a pixel definition layer including a pixel opening;
- an input sensor disposed on the display panel; and
- a light control layer disposed on the input sensor and comprising a light absorbing pattern and a color filter overlapping the pixel opening, wherein the light absorbing pattern comprises a first pattern and a second pattern, wherein the first pattern includes a display opening corresponding to the pixel opening and overlaps the pixel definition layer, and wherein the second pattern is spaced apart from the first pattern and is disposed in the display opening.

* * * * *